United States Patent
Parks

(10) Patent No.: US 8,830,372 B2
(45) Date of Patent: *Sep. 9, 2014

(54) CCD IMAGE SENSOR HAVING MULTIPLE CLOCKING MODES

(75) Inventor: Christopher Parks, Rochester, NY (US)

(73) Assignee: Semiconductor Components Industries, LLC, Phoenix, AZ (US)

(*) Notice: Subject to any disclaimer, the term of this patent is extended or adjusted under 35 U.S.C. 154(b) by 438 days.

This patent is subject to a terminal disclaimer.

(21) Appl. No.: 13/241,526

(22) Filed: Sep. 23, 2011

(65) Prior Publication Data

US 2013/0075581 A1 Mar. 28, 2013

(51) Int. Cl.
*H01L 27/148* (2006.01)

(52) U.S. Cl.
CPC ..... *H01L 27/14843* (2013.01); *H01L 27/14806* (2013.01)
USPC .......................................... 348/312

(58) Field of Classification Search
CPC .. H04N 5/372; H04N 5/37213; H01L 27/148; H01L 27/14812
USPC ................................. 348/312, 311
See application file for complete search history.

(56) References Cited

U.S. PATENT DOCUMENTS

| | | | |
|---|---|---|---|
| 4,661,854 A | 4/1987 | Savoye | |
| 4,819,070 A | 4/1989 | Hynecek | |
| 4,963,952 A | 10/1990 | Janesick | |
| 5,115,458 A | 5/1992 | Burkey et al. | |
| 6,586,784 B1 | 7/2003 | Parks | |
| 6,961,084 B1 | 11/2005 | Duncan et al. | |
| 6,995,795 B1 | 2/2006 | Losee et al. | |
| 7,075,129 B2 | 7/2006 | Parks | |
| 2013/0075580 A1 | 3/2013 | Parks | |
| 2013/0075582 A1 | 3/2013 | Parks | |
| 2013/0075583 A1 | 3/2013 | Parks | |

OTHER PUBLICATIONS

Theuwissen, Albert J. P., *Solid-State Imaging With Charge-Coupled Devices*, Kluwer Academic Publishers, The Netherlands, 1995.

*Primary Examiner* — Gary C Vieaux
(74) *Attorney, Agent, or Firm* — Howard & Howard Attorneys PLLC

(57) ABSTRACT

A CCD image sensor includes vertical CCD shift registers and gate electrodes disposed over the vertical CCD shift registers. The gate electrodes are divided into distinct groups of gate electrodes. The CCD image sensor is adapted to operate in an accumulation mode and a charge transfer mode, an accumulation mode and a charge shifting mode, or an accumulation mode, a charge transfer mode, and a charge shifting mode. The charge transfer mode has an initial charge transfer phase and a final charge transfer phase. The charge shifting mode has an initial charge shifting phase and a final charge shifting phase.

9 Claims, 6 Drawing Sheets

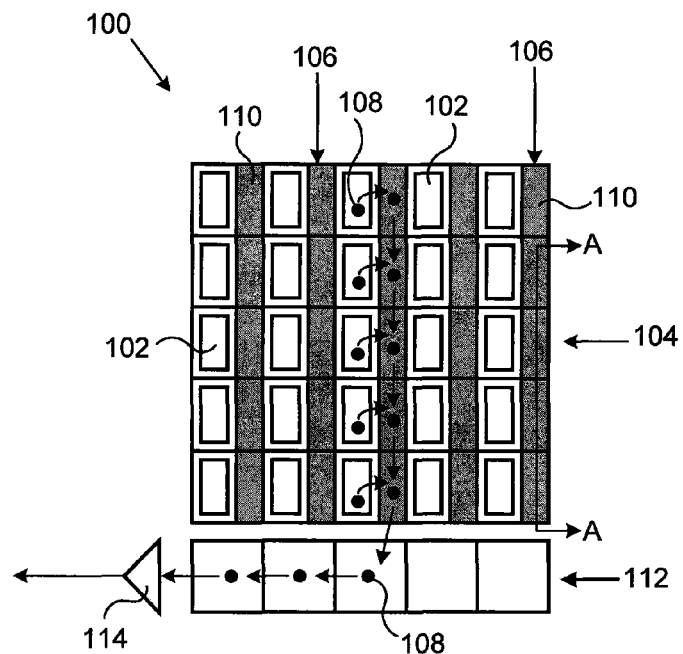
FIG. 1 - Prior Art
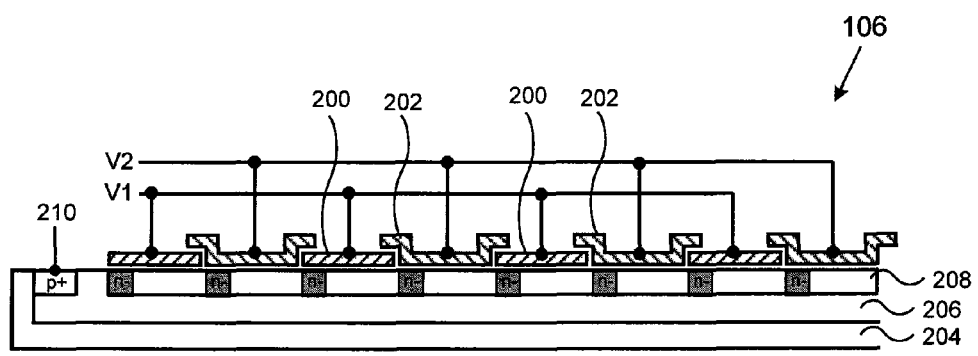
FIG. 2 - Prior Art

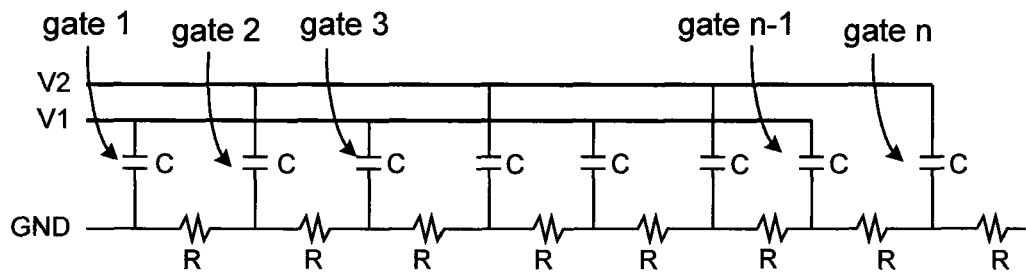
FIG. 3 - Prior Art
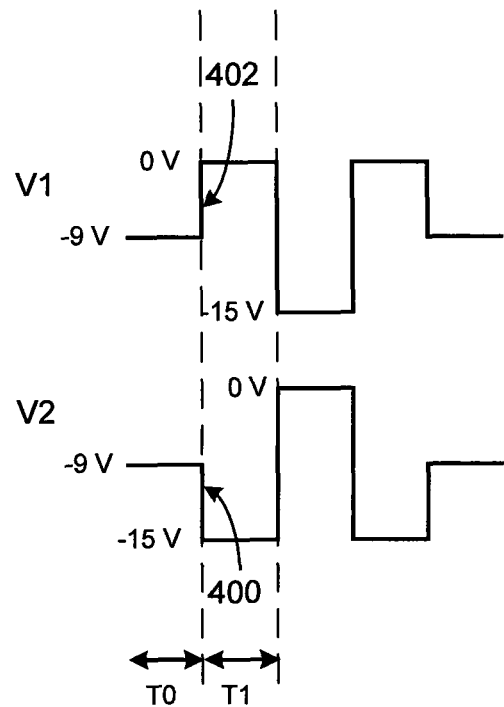
FIG. 4 - Prior Art

US 8,830,372 B2

CCD IMAGE SENSOR HAVING MULTIPLE CLOCKING MODES

CROSS REFERENCE TO RELATED APPLICATIONS

Reference is made to commonly-assigned, U.S. patent application Ser. No. 13/241,500, entitled "MULTIPLE CLOCKING MODES FOR A CCD IMAGER", Ser. No. 13/241,547, entitled "MULTIPLE CLOCKING MODES FOR A CCD IMAGER", Ser. No. 13/241,558, entitled "MULTIPLE CLOCKING MODES FOR A CCD IMAGER", all filed concurrently herewith.

TECHNICAL FIELD

The present invention relates to image sensors for use in digital cameras and other types of image capture devices, and more particularly to Charge-Coupled Device (CCD) image sensors. Still more particularly, the present invention relates to multiple clocking modes for a CCD image sensor.

BACKGROUND

FIG. 1 is a simplified plan view of a prior art interline charge-coupled device (CCD) image sensor. Image sensor 100 includes photodetectors 102 arranged in rows and columns to form an imaging area 104. A vertical CCD (VCCD) shift register 106 is disposed between the columns of photodetectors 102. Charge packets 108 accumulate in the photodetectors 102 in response to incident light. The charge packets are transferred to respective shift register elements 110 in VCCD shift registers 106 and shifted one row at a time to horizontal CCD (HCCD) shift register 112. For simplicity, only one column of charge packets 108 is depicted in FIG. 1. Once in the HCCD shift register 112, the charge packets 108 are serially shifted through HCCD shift register 112 to output circuit 114.

FIG. 2 is a cross-sectional view of VCCD shift register 106 along line A-A shown in FIG. 1. VCCD shift register 106 is depicted as a two-phase CCD, where two distinct gate electrodes 200, 202 are associated with each row of photodetectors. The first gate electrode 200 is clocked with signal V1 and the second gate electrode 202 with signal V2.

VCCD shift register 106 is built on an n-type substrate 204 with a p-type layer 206 disposed between substrate 204 and n-type buried channel 208. The clock signals V1 and V2 alter the potential energy within buried channel 208 to control the shifting of charge packets through the VCCD shift register 106. With an n-type buried channel, the majority charge carriers are electrons that form the charge packets and flow in the n-type buried channel 208. Holes, the minority charge carrier, will flow in the p-type layer 206.

As discussed earlier, the charge packets shifted through buried channel 208 are generated by photons (i.e., light). In an interline CCD image sensor, photons can also produce undesirable electrons known as dark current in the VCCD shift registers. Accumulation mode clocking can be used to reduce the amount of dark current generated in the VCCDs. Accumulation mode clocking maintains all of the gate electrodes 200, 202 at a negative voltage with respect to substrate 204 prior to transferring charge packets from the photodetectors to the VCCD shift registers. This causes holes to accumulate at the surface of the buried channel 208 under the gate electrodes 200, 202. The abundance of holes at the surface suppresses the generation of dark current. Charge packets are then transferred to the VCCD shift registers and gate electrodes 200 and 202 alternately clocked at higher voltage levels to shift the charge packets through the VCCD shift registers 106. The alternating clocking patterns repeat until all of the charge packets have been shifted through the VCCD shift registers 106. A description of the benefits of accumulation mode clocking of CCD's may be found in U.S. Pat. No. 4,963,952 and in the book entitled "Solid-State Imaging with Charge-Coupled Devices" by Albert J. P. Theuwissen.

Because p-type layer 206 is a thin layer confined between substrate 204 and n-type buried channel 208, p-type layer 206 cannot easily act as a source or sink of holes. So when gate electrodes 200, 202 are clocked into accumulation mode, holes flow from well contact 210 at the perimeter of the vertical CCD shift registers through p-type layer 202. The distances the holes must travel from well contact 210 can be long, and p-type layer 202 has a high resistance to the flow of holes.

FIG. 3 illustrates an equivalent circuit of VCCD shift registers across a row in an interline CCD image sensor. The nth gate electrode (gate electrode n) has a capacitance to p-type layer 206 given by C. P-type layer 206 has a resistance from well contact 210 to the nth gate electrode given by (n×R). When the nth gate electrode is clocked into accumulation or depletion, the amount of time it takes for holes to flow from well contact 210 is related to the product of (n×R)×(n×C) $=n^2 \times RC$. For large area CCD image sensors, this amount of time is too long and reduces the advantage of accumulation mode clocking.

Additionally, when only one clock signal, such as V1, has a rising edge from a low voltage (e.g., −9 V) to a higher voltage (e.g., 0 V), the voltage on the resistors will not stay at ground (GND). Instead, the voltage on the resistors will "bounce" positive with the V1 clock edge and slowly return back to ground. This ground bounce produces poor charge shifting through the VCCD shift registers.

U.S. Pat. Nos. 6,586,784 and 6,995,795 address the problem of ground bounce by implementing the timing pattern shown in FIG. 4 for accumulation mode clocking. The clock signals V1 and V2 are clocked to three different voltage levels, a negative −15 volts (V), a negative −9 V, and zero V. During time T0, both the V1 and V2 clock signals are set at −9 V allowing holes to accumulate at the surface of the buried channel. At the transition from time T0 to time T1, the V2 clock signal has a negative going voltage transition 400 to compensate the positive going transition 402 on the V1 clock signal. These compensated voltage transitions can prevent ground bounce by causing no net flow of holes through the p-type layer (e.g. layer 206). This solution, however, can have a serious problem. The −15 V on the clock signals is very negative and can significantly reduce the lifetime of the gate oxides. The −15 V can also cause charge injection through the gate oxide directly into the CCD channel.

SUMMARY

In one aspect, a CCD image sensor includes vertical CCD shift registers and gate electrodes disposed over the vertical CCD shift registers. The gate electrodes are divided into distinct groups of gate electrodes. The CCD image sensor is adapted to operate in a charge shifting mode and in an accumulation mode. In the accumulation mode, an accumulation clock signal is applied to all of the gate electrodes. In an initial charge shifting phase of the charge shifting mode, a depletion clock signal is applied to only one gate electrode in each distinct group of gate electrodes while substantially simultaneously applying a compensation clock signal to all of the remaining gate electrodes in each distinct group of gate electrodes. A collective voltage transition of the compensation clock signal on the remaining gate electrodes in each distinct group of gate electrodes substantially compensates for a voltage transition of the depletion clock signal on the one gate electrode in each distinct group of gate electrodes.

In a final charge shifting phase of the charge shifting mode, the depletion clock signal is applied successively or cyclically to a different one gate electrode in each distinct group of gate electrodes at each time step while substantially simultaneously applying the compensation clock signal to the gate electrode clocked by the depletion clock signal at the previous time step and maintaining the compensation clock signal on the remaining gate electrodes in each distinct group of gate electrodes. A voltage transition of the depletion clock signal on each different one gate electrode in each distinct group of gate electrodes is substantially compensated by a voltage transition of the compensation clock signal on the gate electrode clocked by the depletion clock signal at the previous time step.

In another aspect, a CCD image sensor includes vertical CCD shift registers and gate electrodes disposed over the vertical CCD shift registers. The gate electrodes are divided into distinct groups of gate electrodes. A method for operating the CCD image sensor includes applying, at a first time period, an accumulation clock signal having a first voltage level to all of the gate electrodes disposed over the vertical CCD shift registers for accumulating minority charge carriers. At a second time period, a depletion clock signal having a different second voltage level is applied to a respective one of the gate electrodes in each distinct group of gate electrodes while a compensation clock signal having a different third voltage level is substantially simultaneously applied to all of the remaining gate electrodes in each distinct group of gate electrodes. A difference between the first voltage level and the second voltage level produced at the respective one of the gate electrodes is compensated by a difference between the first voltage level and the third voltage level produced at the remaining gate electrodes in each distinct repeating group of gate electrodes. At a third time period, the depletion clock signal having the second voltage level is applied to another respective one of the gate electrodes in each distinct repeating group of gate electrodes while the compensation clock signal having the third voltage level is substantially simultaneously applied to the previous respective one of the gate electrodes clocked by the depletion clock signal in each distinct group of gate electrodes. A difference between the third voltage level and the second voltage level produced at the another respective one of the gate electrodes is compensated by a difference between the second voltage level and the third voltage level produced at the previous respective one of the gate electrodes in each distinct group of gate electrodes.

In another aspect, a CCD image sensor includes vertical CCD shift registers and gate electrodes disposed over the vertical CCD shift registers. The gate electrodes are divided into distinct repeating groups of gate electrodes. A method for operating the CCD image sensor includes applying, at a first time period, an accumulation clock signal having a first voltage level to all of the gate electrodes of the vertical shift registers. At a second time period, a depletion clock signal having a different second voltage level is applied to a respective one of the gate electrodes in each distinct repeating group of gate electrodes while a compensation clock signal having a different third voltage level is substantially simultaneously applied to the remaining gate electrodes in each distinct repeating group of gate electrodes. A difference between the second voltage level and the third voltage level is greater than a difference between the second voltage level and the first voltage level and a difference between the second voltage level and the first voltage level is greater than a difference between the third voltage level and the first voltage level.

In another aspect, each gate electrode (n) has a capacitance $C_n$. A voltage change on gate electrode n is given by $\Delta V_n$. At each time step, the clock signals applied to the gate electrodes in each distinct group of gate electrodes are patterned or determined so that the sum of products of the capacitances and voltage changes is substantially zero. The sum of products can be represented by the equation $\Sigma C_n \Delta V_n \approx 0$.

In another aspect, a CCD image sensor is adapted to operate in a charge transfer mode and in an accumulation mode. The CCD image sensor includes vertical CCD shift registers and gate electrodes disposed over the vertical CCD shift registers. The gate electrodes are divided into distinct groups of gate electrodes. A method for operating the CCD image sensor includes in an initial charge transfer phase of the charge transfer mode, applying at a first time step an intermediate clock signal to a fraction of the gate electrodes in each distinct group of gate electrodes while substantially simultaneously applying an accumulation clock signal to the remaining gate electrodes in each distinct group of gate electrodes. At a second time step, a transfer clock signal is applied to at least one of the gate electrodes in each distinct group of gate electrodes previously clocked by the intermediate clock signal while the accumulation clock signal is substantially simultaneously applied to the remaining gate electrodes in each distinct group of gate electrodes previously clocked by the intermediate clock signal. In a final charge transfer phase of the charge transfer mode, the transfer clock signal is applied successively to a different fraction of the gate electrodes in each distinct group of gate electrodes at each time step while the accumulation clock signal is substantially simultaneously applied to each gate electrode previously clocked by the transfer clock signal and the accumulation clock signal is maintained on the remaining gate electrodes in each distinct group of gate electrodes.

In another aspect, a CCD image sensor includes photodetectors and vertical CCD shift registers disposed between columns of photodetectors. Gate electrodes are disposed over the vertical CCD shift registers and the gate electrodes are divided into distinct groups of gate electrodes. A method for transferring charge packets from the photodetectors to the vertical CCD shift registers in the CCD image sensor includes applying at a first time period an intermediate clock signal having a first voltage level to a portion of the gate electrodes in each distinct repeating group of gate electrodes. At a second time period, transferring charge packets from a portion of the photodetectors to respective vertical CCD shift registers by applying a transfer clock signal having a different second voltage level to a portion of the gate electrodes previously clocked by the intermediate clock signal and applying an accumulation clock signal having a different third voltage level to the remaining portion of the gate electrodes previously clocked by the intermediate clock signal such that a voltage transition on the gate electrodes clocked by the transfer clock signal is compensated by a voltage transition on the gate electrodes clocked by the accumulation clock signal.

BRIEF DESCRIPTION OF THE FIGURES

Embodiments of the invention are better understood with reference to the following drawings. The elements of the drawings are not necessarily to scale relative to each other.

FIG. 1 is a simplified plan view of a prior art interline charge-coupled device (CCD) image sensor;

FIG. 2 is a cross-sectional view of VCCD shift register 106 along line A-A shown in FIG. 1;

FIG. 3 illustrates an equivalent circuit of VCCD shift registers across a row in an interline CCD image sensor;

FIG. 4 is a prior art timing pattern used to reduce well bounce;

DETAILED DESCRIPTION

Figure 5:
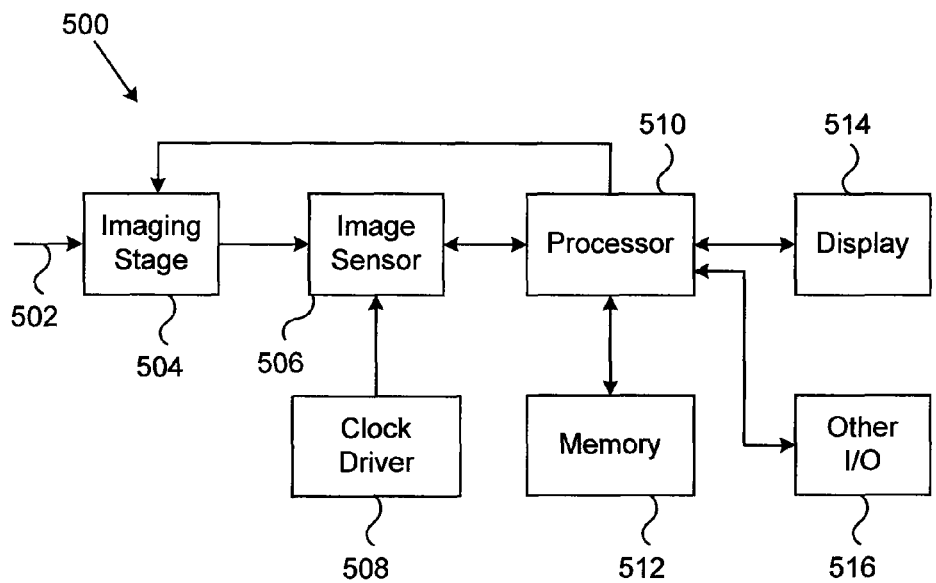
FIG. 5 is a simplified block diagram of an image capture device in an embodiment in accordance with the invention.

Throughout the specification and claims the following terms take the meanings explicitly associated herein, unless the context clearly dictates otherwise. The meaning of "a," "an," and "the" includes plural reference, the meaning of "in" includes "in" and "on." The term "connected" means either a direct electrical connection between the items connected or an indirect connection through one or more passive or active intermediary devices. The term "circuit" means either a single component or a multiplicity of components, either active or passive, that are connected together to provide a desired function. The term "signal" means at least one current, voltage, or data signal.

Additionally, directional terms such as "on", "over", "top", "bottom", "left", "right", are used with reference to the orientation of the Figure(s) being described. Because components of embodiments of the present invention can be positioned in a number of different orientations, the directional terminology is used for purposes of illustration only and is in no way limiting. When used in conjunction with layers of an image sensor wafer or corresponding image sensor, the directional terminology is intended to be construed broadly, and therefore should not be interpreted to preclude the presence of one or more intervening layers or other intervening image sensor features or elements. Thus, a given layer that is described herein as being disposed or formed on or over another layer may be separated from the latter layer by one or more additional layers. When used in conjunction with the construction or operation of an image sensor, the directional terminology is intended to be construed broadly, and therefore should not be interpreted to preclude alternate constructions or operations.

Referring to the drawings, like numbers indicate like parts throughout the views.

FIG. 5 is a simplified block diagram of an image capture device in an embodiment in accordance with the invention. Image capture device 500 is implemented as a digital camera in FIG. 5. Those skilled in the art will recognize that a digital camera is only one example of an image capture device that can utilize an image sensor incorporating the present invention. Other types of image capture devices, such as, for example, cell phone cameras and digital video camcorders, can be used with the present invention.

In digital camera 500, light 502 from a subject scene is input to an imaging stage 504. Imaging stage 504 can include conventional elements such as a lens, a neutral density filter, an iris and a shutter. Light 502 is focused by imaging stage 504 to form an image on image sensor 506. Image sensor 506 captures one or more images by converting the incident light into electrical signals. Image sensor 506 is implemented as a CCD image sensor. Clock driver 508 produces clock signals that are used by image sensor 506. With respect to the present invention, clock driver 508 produces clock signals that are used by image sensor 506 for an accumulation mode, a charge transfer mode, or a charge shifting mode.

Digital camera 500 further includes processor 510, memory 512, display 514, and one or more additional input/output (I/O) elements 516. Although shown as separate elements in the embodiment of FIG. 5, imaging stage 504 may be integrated with image sensor 506, and possibly one or more additional elements of digital camera 500, to form a compact camera module.

Processor 510 may be implemented, for example, as a microprocessor, a central processing unit (CPU), an application-specific integrated circuit (ASIC), a digital signal processor (DSP), or other processing device, or combinations of multiple such devices. Various elements of imaging stage 504 and image sensor 506 can be controlled by timing signals or other signals supplied from processor 510. The function of clock driver 508 can be performed by processor 510 in some embodiments in accordance with the invention. In other embodiments in accordance with the invention, clock driver 508 or a processor performing the function of clock driver 508 can be integrated with image sensor 506.

Memory 512 can be configured as any type of memory, such as, for example, random access memory (RAM), read-only memory (ROM), Flash memory, disk-based memory, removable memory, or other types of storage elements, in any combination. A given image captured by image sensor 506 may be stored by processor 510 in memory 512 and presented on display 514. Additionally, the function of clock driver 508 can be performed by memory 512 and processor 510 in another embodiment in accordance with the invention. The clock signals for the accumulation mode, the charge transfer mode, or the charge shifting mode can be stored in memory 512 and read out by processor 510. Memory 512, processor 510, or both memory 512 and processor 510 can be integrated with image sensor 506 in embodiments in accordance with the invention.

Display 514 is typically an active matrix color liquid crystal display (LCD), although other types of displays may be used. The additional I/O elements 516 may include, for example, various on-screen controls, buttons or other user interfaces, network interfaces, or memory card interfaces.

It is to be appreciated that the digital camera shown in FIG. 5 may comprise additional or alternative elements of a type known to those skilled in the art. Elements not specifically shown or described herein may be selected from those known in the art. As noted previously, the present invention may be implemented in a wide variety of image capture devices. Also, certain aspects of the embodiments described herein may be implemented at least in part in the form of software executed by one or more processing elements of an image capture device. Such software can be implemented in a straightforward manner given the teachings provided herein, as will be appreciated by those skilled in the art.

Figure 6A:
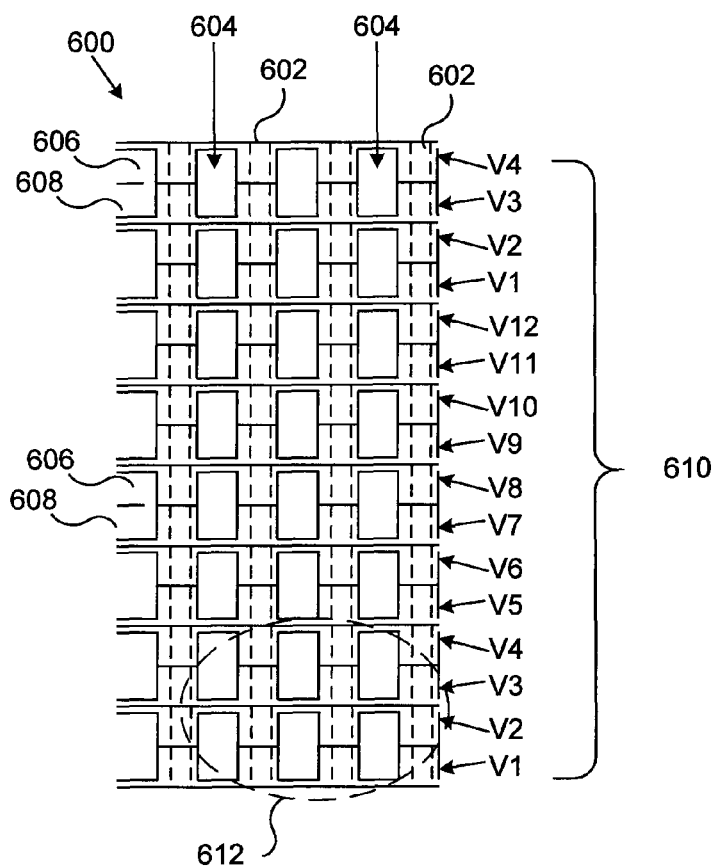
FIGS. 6A-6B are simplified plan views of an imaging area for an interline CCD image sensor in an embodiment in accordance with the invention.
Figure 6B:
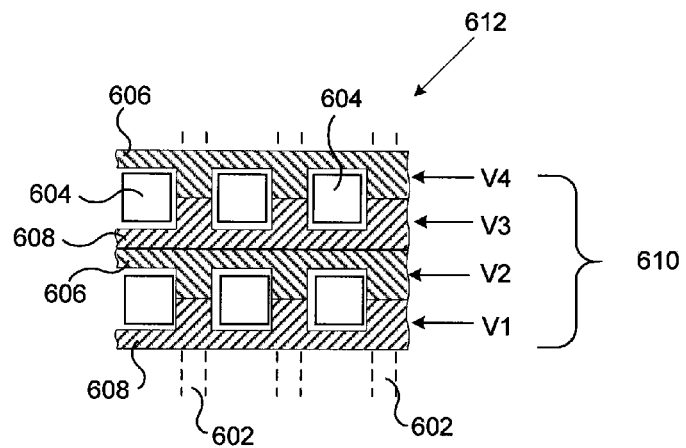

Referring now to FIGS. 6A-6B, there are shown simplified plan views of an imaging area for an interline CCD image sensor in an embodiment in accordance with the invention. Imaging area 600 includes vertical CCD (VCCD) shift registers 602. A column of photodetectors 604 is adjacent to each VCCD shift register 602. In the illustrated embodiment, two distinct gate electrodes 606, 608 are associated with each row. The two gate electrodes 606, 608 are disposed over VCCD shift registers 602 and are used to shift charge packets through the VCCD shift registers. For simplicity and clarity, gate electrodes 606, 608 are shown disposed over only a portion of imaging area 600. Signal lines V1 through V12 (collectively 610) are used to apply independent clock signals to gate electrodes 606, 608.

FIG. 6B depicts a more detailed view of the arrangement of the gate electrodes 606, 608 disposed over imaging area 600. The gate electrodes 606, 608 do not cover photodetectors 604. Instead, the gate electrodes 606, 608 are disposed around and extend between photodetectors 604 such that gate electrodes 606, 608 are disposed over VCCD shift registers 602. In practice, in a multi-phase CCD, such as with a two phase CCD, one set of gate electrodes overlaps another set of gate electrodes. This is not shown in FIGS. 6A-6B for simplicity. Other embodiments in accordance with the invention can dispose the gate electrodes over both the photodetectors and the VCCD shift registers. In full frame CCD image sensors, the gate electrodes are disposed over the VCCD shift registers since the shift register elements in the VCCD shift registers are photosensitive and collect charge packets.

Although FIG. 6A depicts a repeating pattern of twelve signal lines that are applied to twelve gate electrodes with two gate electrodes per row of photodetectors, in practice there is a repeating pattern of N number of gate electrodes with M gate electrodes per row in embodiments in accordance with the invention. Each set of N gate electrodes form a distinct group of gate electrodes, and each group has M number of gate electrodes per row of photodetectors, where M is greater than one and less than N in an embodiment in accordance with the invention. In the embodiment shown in FIG. 6A, each distinct group of gate electrodes has twelve gate electrodes (N=12) with two gate electrodes (M=2) associated with each row of photodetectors. Other embodiments in accordance with the invention can group the gate electrodes differently, such as, for example, into groups of eight gate electrodes (N=8) with four gate electrodes per row (M=4).

The number of independent clock signals equals N, the number of gate electrodes in each distinct group of gate electrodes.

Figure 7:
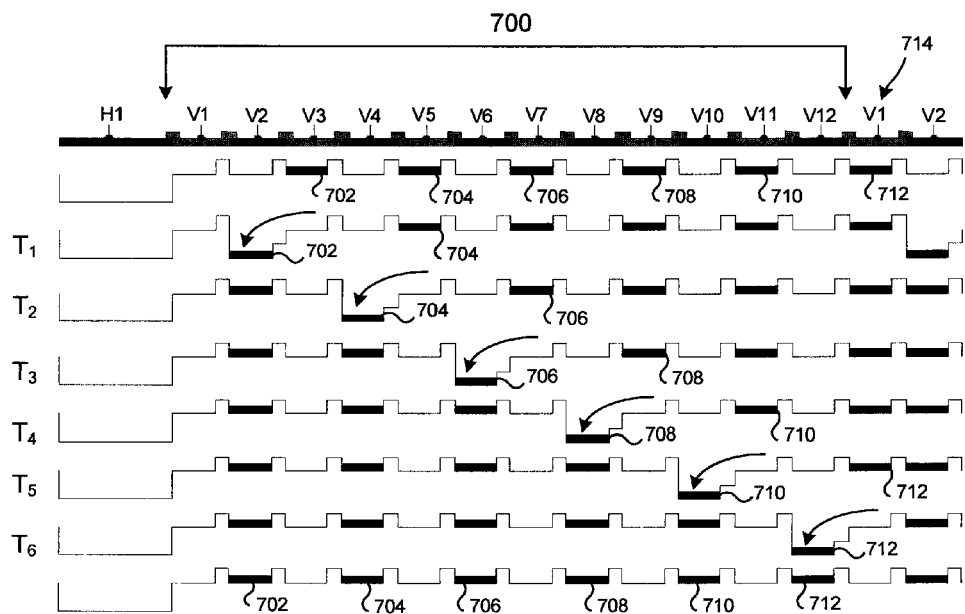
FIG. 7 illustrates a group of twelve gate electrodes and associated clocking diagrams in an embodiment in accordance with the invention.

FIG. 7 depicts a group of twelve gate electrodes (N=12) and associated potential energy clocking diagrams in an embodiment in accordance with the invention. In the illustrated embodiment, the group of twelve gate electrodes 700 (N=12) is associated with six rows in an imaging area because the VCCD shift registers are implemented as two-phase (M=2) VCCD shift registers. Other embodiments in accordance with the invention can implement the VCCD shift registers with any number of phases.

The group of twelve gate electrodes 700 is included in a larger imaging area (not shown). The charge shifting process shifts only one charge packet forward (i.e., toward the horizontal CCD shift register) at each time step. Each gate electrode only spends a short amount of time in depletion mode. By way of example only, each gate electrode can spend only two microseconds in depletion mode. The gate electrode placed in depletion mode ripples through all twelve gate electrodes to shift a charge packet by only one gate electrode. For example, in a two-phase CCD image sensor where each row has two gate electrodes, the clock pulse ripples through the gate electrodes twice to advance a charge packet by one full row.

Figure 8:
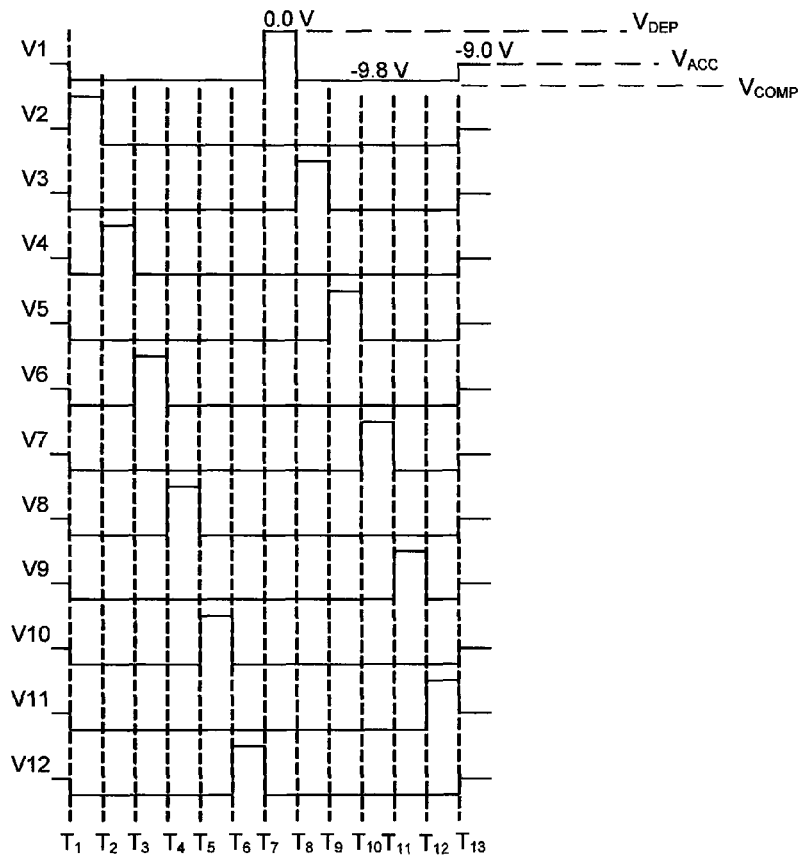
FIG. 8 is an exemplary clocking diagram for the twelve gate electrodes illustrated in FIG. 7.

FIG. 8 is an exemplary clocking diagram for the twelve gate electrodes illustrated in FIG. 7. FIG. 8 is described in conjunction with the charge shifting diagrams in FIG. 7. The gate electrodes are clocked independently in an embodiment in accordance with the invention. Prior to time T1, all of the gate electrodes are placed in accumulation mode by applying an accumulation clock signal ($V_{ACC}$) to the gate electrodes. Minority carriers (e.g., holes) accumulate at the surface of the buried channel in the VCCD shift registers during the accumulation mode. Charge packets 702, 704, 706, 708, 710, 712 are stored in the buried channel under gate electrodes V3, V5, V7, V9, V11, V1 respectively.

At time T1, only one gate electrode is placed in depletion mode by applying a depletion clock signal ($V_{DEP}$) to that gate electrode. In the illustrated embodiment of FIG. 8, gate electrode V2 is placed in depletion mode. At substantially the same time as the rising edge of the $V_{DEP}$ clock signal, a compensation clock signal ($V_{COMP}$) having a falling edge at time T1 is applied to the remaining gate electrodes in the group 700. As shown in FIG. 7, charge packet 702 shifts forward one gate electrode in response to the application of the $V_{DEP}$ clock signal to gate electrode V2. Charge packet 702 shifts from under gate electrode V3 to under gate electrode V2.

In the FIG. 8 embodiment, $V_{ACC}$ is −9 volts, $V_{DEP}$ is 0 volts, and $V_{COMP}$ is −9.8 volts so that $V_{COMP} < V_{ACC} < V_{DEP}$. The voltage level of $V_{ACC}$ is between the voltage levels of $V_{COMP}$ and $V_{DEP}$. Application of the $V_{DEP}$ clock signal clocks only one gate electrode in each distinct group of gate electrodes from −9 volts to 0 volts, a difference of 9 volts. To compensate for the 9 volt rising edge of the $V_{DEP}$ clock signal, the remaining eleven gate electrodes in each distinct group of gate electrodes are substantially simultaneously clocked with clock signal $V_{COMP}$. The voltage on each of the remaining eleven gate electrodes transitions from −9 volts to −9.8 volts at time T1, a difference of −0.8 volts. Thus, the 9 V voltage transition of the $V_{DEP}$ clock signal is compensated by the eleven −0.8 V voltage transitions of the $V_{COMP}$ clock signal on gate electrodes V1 and V3-V12. The magnitude of the voltage transition in one direction or polarity (e.g., positive) on one gate electrode in group 700 is compensated by a collective magnitude voltage transition in an opposite direction or polarity (e.g., negative) on the remaining gate electrodes in group 700.

Referring to time T2 in FIG. 8, only gate electrode V4 in each group of gate electrodes is placed in depletion mode by applying the depletion clock signal ($V_{DEP}$) to the gate electrode. At substantially the same time as the rising edge of the $V_{DEP}$ clock signal, the compensation clock signal ($V_{COMP}$) is applied to gate electrode V2, the gate electrode clocked by the $V_{DEP}$ clock signal at the previous time step (time T1). The $V_{COMP}$ clock signal is maintained on gate electrodes V1, V3, and V5-V12 in group 700. The +9.8 V voltage transition (the rising edge) of the $V_{DEP}$ clock signal on gate electrode V4 is compensated by the −9.8 V voltage transition (the falling edge) of the $V_{COMP}$ clock signal on gate electrode V2.

As shown in FIG. 7, charge packet 704 shifts forward one gate electrode in response to the application of the depletion clock signal ($V_{DEP}$) to gate electrode V4. Charge packet 704 shifts from under gate electrode V5 to under gate electrode V4.

At time T3, only gate electrode V6 in group 700 is placed in depletion mode by applying $V_{DEP}$ clock signal to the gate electrode. At substantially the same time as the rising edge of the $V_{DEP}$ clock signal, $V_{COMP}$ is applied to gate electrode V4, the gate electrode clocked by the $V_{DEP}$ clock signal at the previous time step (time T2). The $V_{COMP}$ clock signal is maintained on gate electrodes V1-V3, V5, and V7-V12 in group 700. The +9.8 V voltage transition (the rising edge) of the $V_{DEP}$ clock signal on gate electrode V6 is compensated by the −9.8 V voltage transition (the falling edge) of the $V_{COMP}$ clock signal on gate electrode V4.

As shown in FIG. 7, charge packet 706 shifts forward one gate electrode in response to the application of the depletion clock signal ($V_{DEP}$) to gate electrode V6. Charge packet 706 shifts from under gate electrode V7 to under gate electrode V6.

At time T4, only gate electrode V8 is placed in depletion mode by applying $V_{DEP}$ to the gate electrode. At substantially the same time as the rising edge of the $V_{DEP}$ clock signal on gate electrode V8, $V_{COMP}$ is applied to gate electrode V6, the gate electrode clocked by the $V_{DEP}$ clock signal at the previous time step (time T3). The $V_{COMP}$ clock signal is maintained on gate electrodes V1-V5, V7, and V9-V12 in group 700. The +9.8 V voltage transition (the rising edge) of the $V_{DEP}$ clock signal on gate electrode V8 is compensated by the −9.8 V voltage transition (the falling edge) of the $V_{COMP}$ clock signal on gate electrode V6.

As shown in FIG. 7, charge packet 708 shifts forward one gate electrode in response to the application of the depletion clock signal ($V_{DEP}$) to gate electrode V8. Charge packet 708 shifts from under gate electrode V9 to under gate electrode V8.

At time T5, only gate electrode V10 is placed in depletion mode by applying $V_{DEP}$ to the gate electrode. At substantially the same time as the rising edge of the $V_{DEP}$ clock signal, the clock signal $V_{COMP}$ is applied to gate electrode V8, the gate electrode clocked by the $V_{DEP}$ clock signal at the previous time step (time T4). The $V_{COMP}$ clock signal is maintained on gate electrodes V1-V7, V9, V11, and V12 in group 700. The +9.8 V voltage transition (the rising edge) of the $V_{DEP}$ clock signal on gate electrode V10 is compensated by the −9.8 V voltage transition (the falling edge) of the $V_{COMP}$ clock signal on gate electrode V8.

As shown in FIG. 7, charge packet 710 shifts forward one gate electrode in response to the application of the depletion clock signal ($V_{DEP}$) to gate electrode V10. Charge packet 710 shifts from under gate electrode V11 to under gate electrode V10.

At time T6, only gate electrode V12 is placed in depletion mode by applying $V_{DEP}$ to the gate electrode. At substantially the same time as the rising edge of the $V_{DEP}$ clock signal, $V_{COMP}$ is applied to gate electrode V10, the gate electrode clocked by the $V_{DEP}$ clock signal at the previous time step (time T5). The $V_{COMP}$ clock signal is maintained on gate electrodes V1-V9 and V11 in group 700. The +9.8 V voltage transition (the rising edge) of the $V_{DEP}$ clock signal on gate electrode V12 is compensated by the −9.8 V voltage transition (the falling edge) of the $V_{COMP}$ clock signal on gate electrode V10.

As shown in FIG. 7, charge packet 712 shifts forward one gate electrode in response to the application of the depletion clock signal ($V_{DEP}$) to gate electrode V12. Charge packet 712 shifts from under gate electrode V1 to under gate electrode V12. Gate electrode V1 (see 714) is in the adjacent group of twelve gate electrodes.

At the end of time T6, all of the charge packets have shifted forward one gate electrode. In a two-phase CCD shift register, the charge packets must move forward two gate electrodes to shift to the next row. So the clock signals depicted in FIG. 8 continue through six additional time steps. At time T7, only gate electrode V1 is placed in depletion mode by applying $V_{DEP}$ to the gate electrode. At substantially the same time as the rising edge of the $V_{DEP}$ clock signal, $V_{COMP}$ is applied to gate electrode V12, the gate electrode clocked by the $V_{DEP}$ clock signal at the previous time step (time T6). The $V_{COMP}$ clock signal is maintained on gate electrodes V2-V11 in group 700.

Charge packet 702 shifts forward one gate electrode in response to the application of the depletion clock signal ($V_{DEP}$) to gate electrode V1 (not shown). Charge packet 702 shifts from under gate electrode V2 to under gate electrode V1. The +9.8 V voltage transition (the rising edge) of the $V_{DEP}$ clock signal on gate electrode V1 is compensated by the −9.8 V voltage transition (the falling edge) of the $V_{COMP}$ clock signal on gate electrode V12.

At time T8, only gate electrode V3 is placed in depletion mode by applying $V_{DEP}$ to the gate electrode. At substantially the same time as the rising edge of the $V_{DEP}$ clock signal, $V_{COMP}$ is applied to gate electrode V1, the gate electrode clocked by the $V_{DEP}$ clock signal at the previous time step (time T7). The $V_{amp}$ clock signal is maintained on gate electrodes V2 and V4-V12 in group 700.

Charge packet 704 shifts forward one gate electrode in response to the application of the $V_{DEP}$ clock signal to gate electrode V3 (not shown). Charge packet 704 shifts from under gate electrode V4 to under gate electrode V3. The +9.8 V voltage transition (the rising edge) of the depletion clock signal ($V_{DEP}$) on gate electrode V3 is compensated by the −9.8 V voltage transition (the falling edge) of the $V_{COMP}$ clock signal on gate electrode V1.

At time T9, only gate electrode V5 is placed in depletion mode by applying $V_{DEP}$ to the gate electrode. At substantially the same time as the rising edge of the $V_{DEP}$ clock signal, $V_{COMP}$ is applied to gate electrode V3, the gate electrode clocked by the $V_{DEP}$ clock signal at the previous time step (time T8). The $V_{COMP}$ clock signal is maintained on gate electrodes V1, V2, V4 and V6-V12 in group 700.

Charge packet 706 shifts forward one gate electrode in response to the application of the $V_{DEP}$ clock signal to gate electrode V5 (not shown). Charge packet 706 shifts from under gate electrode V6 to under gate electrode V5. The +9.8 V voltage transition (the rising edge) of the depletion clock signal ($V_{DEP}$) is compensated by the −9.8 V voltage transition (the falling edge) of the $V_{COMP}$ clock signal on gate electrode V3.

At time T10, only gate electrode V7 is placed in depletion mode by applying $V_{DEP}$ to the gate electrode. At substantially the same time as the rising edge of the $V_{DEP}$ clock signal, $V_{COMP}$ is applied to gate electrode V5, the gate electrode clocked by the $V_{DEP}$ clock signal at the previous time step (time T9). The $V_{COMP}$ clock signal is maintained on gate electrodes V1-V4, V6 and V8-V12 in group 700.

Charge packet 708 shifts forward one gate electrode in response to the application of the depletion clock signal ($V_{DEP}$) to gate electrode V7 (not shown). Charge packet 708 shifts from under gate electrode V8 to under gate electrode V7. The +9.8 V voltage transition (the rising edge) of the $V_{DEP}$ clock signal on gate V7 is compensated by the −9.8 V voltage transition (the falling edge) of the $V_{COMP}$ clock signal on gate electrode V5.

At time T11, only gate electrode V9 is placed in depletion mode by applying $V_{DEP}$ to the gate electrode. At substantially the same time as the rising edge of the $V_{DEP}$ clock signal, $V_{COMP}$ is applied to gate electrode V7, the gate electrode clocked by the $V_{DEP}$ clock signal at the previous time step. The $V_{COMP}$ clock signal is maintained on gate electrodes V1-V6, V8, and V10-V12 in group 700.

Charge packet 710 shifts forward one gate electrode in response to the application of the depletion clock signal ($V_{DEP}$) to gate electrode V9 (not shown). Charge packet 710 shifts from under gate electrode V10 to under gate electrode V9. The +9.8 V voltage transition (the rising edge) of the $V_{DEP}$ clock signal on gate electrode V9 is compensated by the −9.8 V voltage transition (the falling edge) of the $V_{COMP}$ clock signal on gate electrode V7.

At time T12, only gate electrode V11 is placed in depletion mode by applying $V_{DEP}$ to the gate electrode. At substantially the same time as the rising edge of the $V_{DEP}$ clock signal, the clock signal $V_{COMP}$ is applied to gate electrode V9, the gate electrode clocked by the $V_{DEP}$ clock signal at the previous time step (time T11). The $V_{COMP}$ clock signal is maintained on gate electrodes V1-V8, V10 and V12 in group 700.

Charge packet 712 shifts forward one gate electrode in response to the application of the depletion clock signal ($V_{DEP}$) to gate electrode V11 (not shown). Charge packet 712 shifts from under gate electrode V12 to under gate electrode V11. The +9.8 V voltage transition (the rising edge) of the $V_{DEP}$ clock signal on gate electrode V11 is compensated by the −9.8 V voltage transition (the falling edge) of the $V_{COMP}$ clock signal on gate electrode V9.

At the end of time T12, all of the charge packets have shifted forward two gate electrodes in the VCCD shift registers and the accumulation clock signal $V_{ACC}$ is applied to all of the gate electrodes. The pattern of clock signals depicted in FIG. 8 repeat until all of the charge packets have been shifted out of the VCCD shift registers.

As described earlier, each gate electrode n has a capacitance $C_n$. A voltage transition on gate electrode n is given by $\Delta V_n$. In the embodiment of FIG. 8, the clock signals applied to the gate electrodes in each distinct group of gate electrodes are patterned or determined so that the sum of products of the capacitances and voltage changes is substantially zero. The sum of products can be represented by the equation $\Sigma C_n \Delta V_n \approx 0$.

Figure 9:
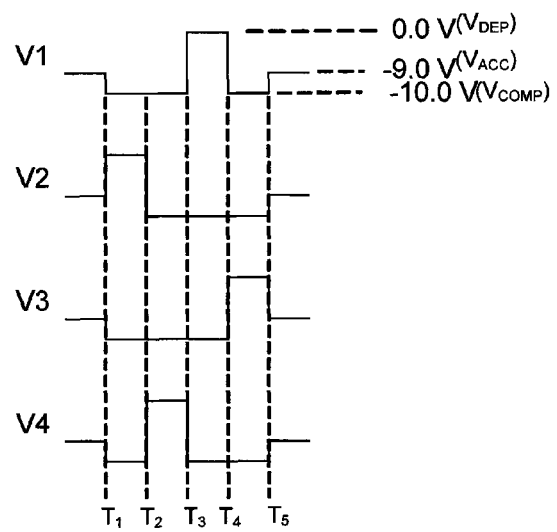
FIG. 9 depicts one example of a clocking diagram for four-phase vertical CCD shift registers in an embodiment in accordance with the invention.

Referring now to FIG. 9, there is shown one example of a clocking diagram for four-phase vertical CCD shift registers in an embodiment in accordance with the invention. The timing diagram can be used, for example, with a two-field interlaced CCD image sensor, where the gate electrodes of the four phase vertical CCD shift register are spread out across two rows resulting in two gate electrodes per row. In the illustrated clocking diagram, each distinct group of gate electrodes includes four gate electrodes (N=4) with two gate electrodes per row (M=2) and the four gate electrodes are clocked independently. The accumulation clock signal $V_{ACC}$ is −9 volts, the depletion clock signal $V_{DEP}$ is 0 volts, and the compensation clock signal $V_{COMP}$ is −10 volts in the FIG. 9 embodiment ($V_{COMP} < V_{ACC} < V_{DEP}$). The different clock signals are determined so that the sum of products of the capacitances and voltage changes for at least a portion of a clocking cycle is substantially zero ($\Sigma C_n \Delta V_n \approx 0$). As is described in more detail later, in the illustrated embodiment the different clock signals are determined so that the sum of products of the capacitances and voltage changes during the final charge shifting phase is substantially zero ($\Sigma C_n \Delta V_n \approx 0$).

At time T1, only gate electrode V2 is placed in depletion mode by applying the depletion clock signal $V_{DEP}$ to the gate electrode. At substantially the same time as the rising edge of the $V_{DEP}$ clock signal, the clock signal $V_{COMP}$ is applied to the remaining gate electrodes in the group. The voltage transition on gate electrode V2 equals +9 volts while the voltage transition on gate electrodes V1, V3, and V4 combined equals −3 volts. Thus, the voltage transition on gate electrode V2 is only partially compensated at time T1 in the illustrated embodiment.

Only one charge packet shifts forward one gate electrode in response to the application of the depletion clock signal ($V_{DEP}$) to gate electrode V2 (not shown). The charge packet shifts from under gate electrode V3 to under gate electrode V2.

At time T2, only gate electrode V4 is placed in depletion mode by applying the depletion clock signal $V_{DEP}$ to the gate electrode. At substantially the same time as the rising edge of the $V_{DEP}$ clock signal, the compensation clock signal $V_{COMP}$, is applied to gate electrode V2. Gate electrode V2 is the gate clocked by the clock signal $V_{DEP}$ at the previous time step (time T1). $V_{COMP}$ continues to be applied to gate electrodes V1 and V3. The voltage transition (the rising edge) of $V_{DEP}$ on gate electrode V4 equals +10 volts while the voltage transition (the falling edge) of $V_{COMP}$ on gate electrode V2 equals −10 volts. Thus, the voltage transition of $V_{DEP}$ on gate electrode V4 is fully compensated by the voltage transition of $V_{COMP}$ on gate electrode V2.

Only one charge packet shifts forward one gate electrode in response to the application of the depletion clock signal ($V_{DEP}$) to gate electrode V4 (not shown). The charge packet shifts from under gate electrode V1 in the adjacent group to under gate electrode V4.

At time T3, only gate electrode V1 is placed in depletion mode by applying the depletion clock signal $V_{DEP}$ to the gate electrode. At substantially the same time as the rising edge of the depletion clock signal $V_{DEP}$, the compensation clock signal $V_{COMP}$ is applied to gate electrode V4. Gate electrode V4 is the gate clocked by $V_{DEP}$ at the previous time step (time T2). The compensation clock signal $V_{COMP}$ continues to be applied to gate electrodes V2 and V3. The voltage transition (the rising edge) of $V_{DEP}$ on gate electrode V1 is +10 volts while the voltage transition (the falling edge) of $V_{COMP}$ on gate electrode V4 is −10 volts. Thus, the voltage transition of $V_{DEP}$ on gate electrode V1 is fully compensated by the voltage transition of $V_{COMP}$ on gate electrode V4 in the illustrated embodiment.

Only one charge packet shifts forward one gate electrode in response to the application of the depletion clock signal $V_{DEP}$ to gate electrode V1 (not shown). The charge packet shifts from under gate electrode V2 to under gate electrode V1.

At time T4, only gate electrode V3 is placed in depletion mode by applying the depletion clock signal $V_{DEP}$ to the gate electrode. At substantially the same time as the rising edge of the depletion clock signal $V_{DEP}$, the compensation clock signal $V_{COMP}$ is applied to gate electrode V1. Gate electrode V1 is the gate electrode clocked by $V_{DEP}$ at the previous time step (time T3). $V_{COMP}$ continues to be applied to gate electrodes V2 and V4. The voltage transition (the rising edge) of the depletion clock signal $V_{DEP}$ on gate electrode V3 is +10 volts while the voltage transition (the falling edge) of $V_{COMP}$ on gate electrode V1 is −10 volts. Thus, the voltage transition of $V_{DEP}$ on gate electrode V3 is compensated fully by the voltage transition of $V_{COMP}$ on gate electrode V1 in the illustrated embodiment.

At the end of time T4, all of the charge packets have shifted forward two gate electrodes and the accumulation clock signal $V_{ACC}$ is applied to all of the gate electrodes. The voltage transition on gate electrode V3 is −9 volts while the voltage transition on gate electrodes V1, V2, and V4 combined equals +3 volts. Thus, the voltage transition of $V_{DEP}$ on gate electrode V3 is only partially compensated at time T5 in the illustrated embodiment.

There are two operating modes for a CCD image sensor in an embodiment in accordance with the invention. One mode is an accumulation mode where an accumulation clock signal is applied to all of the gate electrodes. This mode is illustrated prior to time T1 and at time T13 in FIG. 8 and prior to time T1 and at time T5 in FIG. 9. Minority carriers (e.g., holes) accumulate at the surface of the buried channel in the VCCD shift registers during the accumulation mode.

The other mode is a charge shifting mode. The charge shifting mode includes two phases, an initial charge shifting phase followed by a final charge shifting phase. The initial charge shifting phase is depicted at time T1 in FIGS. 8 and 9. During the initial charge shifting phase, a depletion clock signal $V_{DEP}$ is applied to only one gate electrode in each distinct group of gate electrodes while substantially simultaneously applying a compensation clock signal $V_{COMP}$ to all of the remaining gate electrodes in each distinct group of gate electrodes. The compensation by the collective voltage transitions of $V_{COMP}$ can compensate fully or partially for the voltage transition of $V_{DEP}$ in embodiments in accordance with the invention.

The final charge shifting phase is depicted at times T2-T12 in FIG. 8 and at times T2-T4 in FIG. 9. During the final charge shifting phase, the depletion clock signal $V_{DEP}$ is applied successively or cyclically to a different one gate electrode in each distinct group of gate electrodes at each time step while substantially simultaneously applying the compensation clock signal $V_{COMP}$ to the gate electrode clocked by the depletion clock signal $V_{DEP}$ at the previous time step and while maintaining the accumulation clock signal $V_{COMP}$ on the remaining gate electrodes in each distinct group of gate electrodes. The voltage transition of $V_{DEP}$ is compensated fully by the voltage transition of $V_{COMP}$. The magnitude of the voltage transition in one direction or polarity (e.g., positive) on the one gate electrode in each distinct group of gate electrodes is compensated by an equal magnitude voltage transition in an opposite direction or polarity (e.g., negative) on another gate electrode in each distinct group of gate electrodes.

In one embodiment in accordance with the invention, application of the depletion clock signal $V_{DEP}$ and application of the compensation clock signal $V_{COMP}$ cycle through the even numbered gate electrodes and then through the odd numbered gate electrodes. For example, in the embodiment shown in FIG. 8, $V_{DEP}$ is applied, in order, to gate electrode V2, gate electrode V4, gate electrode V6, gate electrode V8, gate electrode V10, and gate electrode V12 before cycling through the odd numbered gate electrodes V1, V3, V5, V7, V9, and V11. $V_{COMP}$ is applied, in order, to gate electrode V2, gate electrode V4, gate electrode V6, gate electrode V8, gate electrode V10, and gate electrode V12 before cycling through the odd numbered gate electrodes V1, V3, V5, V7, V9, and V11. The $V_{DEP}$ clock signal and the $V_{COMP}$ clock signal can be applied to adjacent even numbered gate electrodes (e.g., gate electrode V4 and V2, respectively) and adjacent odd numbered gate electrodes (e.g., gate electrode V7 and gate electrode V5, respectively). Other embodiments in accordance with the invention can cycle through the gate electrodes in each distinct group of gate electrodes differently. For example, the embodiment of FIG. 12 illustrates the gate electrodes being cycled through in a different order by the clocking diagram in FIG. 13, but still accomplishing the same final charge shifting results as the embodiment of FIG. 8.

One advantage to the embodiments shown in FIGS. 8 and 9 is the compensation clock signal $V_{COMP}$ voltage is only −9.8 V and −10 V, respectively, compared to the −15 V of the prior art. The reliability of the gate oxides is improved by changing the most negative voltage of a clock signal to a smaller negative value.

Well bounce can be reduced or eliminated through the compensating timing patterns shown and described in conjunction with FIGS. 8 and 9. The compensating clock signals in these timing patterns are applied to the gate electrodes used to shift charge packets through the VCCD shift registers. As described in more detail below, well bounce can also be reduced or eliminated through compensating clock signals applied to the gate electrodes used to transfer charge packets from the photodetectors to the VCCD shift registers. The compensating clock signals used to transfer charge packets from the photodetectors to the VCCD shift registers can be used independent of, or in combination with, the compensating clock signals applied to the gate electrodes to shift charge packets through the VCCD shift registers.

Figure 10:
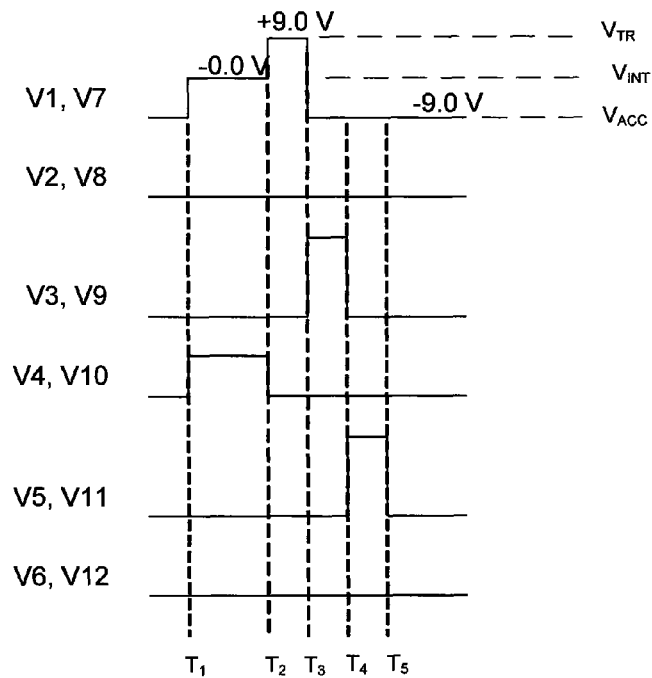
FIG. 10 illustrates a first example of a clocking diagram for transferring charge from the photodetectors to respective shift register elements in the VCCD shift registers in an interline CCD image sensor in an embodiment in accordance with the invention.

FIG. 10 illustrates a first example of a clocking diagram for transferring charge from the photodetectors to respective shift register elements in the VCCD shift registers in an interline CCD image sensor in an embodiment in accordance with the invention. The clocking diagram is suitable for use in a CCD image sensor having twelve gate electrodes (N=12) in each group of gate electrodes. The clocking diagram of FIG. 10 will be described in conjunction with the vertical CCD shift register gate electrode arrangement shown in FIG. 7. Thus, the VCCD shift registers are implemented as two-phase VCCD shift registers where two gate electrodes are associated with each row of photodetectors.

Prior to time T1, the accumulation clock signal $V_{ACC}$ is applied to all of the gate electrodes to place the gate electrodes in accumulation mode. To transfer charge from the photodetectors to the VCCD shift registers, a large voltage change is applied to half of the gate electrodes because all gate electrodes are in accumulation mode. By way of example only, when $V_{ACC}$ is −9 volts and a transfer clock signal $V_{TR}$ of +9 volts is needed to transfer charge from the photodetectors, a voltage transition of +18 volts must be applied to half of the gate electrodes to transfer the charge from the photodetectors to the VCCD shift registers. The +18 V voltage transition can produce a large amount of undesirable well bounce. The clocking diagram shown in FIG. 10 reduces the amount of well bounce when transferring charge from the photodetectors to the VCCD shift registers.

At time T1, an intermediate clock signal $V_{INT}$ is applied to a fraction of the gate electrodes. In the illustrated embodiment, $V_{INT}$ is applied to gate electrodes V1, V4, V7, and V10. These four gate electrodes, V1, V7, V4, V10, have uncompensated voltage transitions (e.g., rising edges) at time T1 because there is no voltage transition on the remaining gate electrodes V2, V3, V5, V6, V8, V9, V11, and V12. The voltage transitions on gate electrodes V1, V7, V4, and V10 is +9 volts (from −9 volts to 0 volts). In the illustrated embodiment, a time delay between time T1 and time T2 allows the well to settle before the next voltage change occurs at time T2. For example, the time delay can be at least four hundred microseconds. The four hundred microsecond delay is suitable for the charge packet transfer from the photodetectors because the voltage change at time T1 happens once per image. A time delay of any length can be used in other embodiments in accordance with the invention.

At time T2, the transfer clock signal $V_{TR}$ is applied to gate electrodes V1 and V7 while the accumulation clock signal $V_{ACC}$ is applied to gate electrodes V4 and V10. Gate electrodes V1, V4, V7, and V10 are the gate electrodes clocked by the intermediate clock signal $V_{INT}$ at the previous time step (time T1). The charge packets in the photodetectors associated with gate electrodes V1 and V7 transfer to respective shift register elements in the VCCD shift registers in response to the application of the $V_{TR}$ clock signal. If gate electrode V1 is associated with row 1 and gate electrode V7 with row 4, the charge packets in the photodetectors in rows 1 and 4 transfer to the vertical CCD shift registers. The voltage transitions of $V_{TR}$ on gate electrodes V1 and V7 are compensated fully by the voltage transitions of $V_{ACC}$ on gate electrodes V4 and V10.

The 0 volt voltage level shown in FIG. 10 is an intermediate clock signal $V_{INT}$ that is applied to four gate electrodes V1, V7, V4, and V10 at time T1. The falling edge of $V_{INT}$ on gate electrodes V4, V10 at time T2 has a voltage change of −9 volts. Thus, the −9 volt voltage change on gate electrodes V4 and V10 fully compensated by the +9 volt voltage change on gate electrodes V1 and V7.

At time T3, the transfer clock signal $V_{TR}$ is applied to gate electrodes V3 and V9 while the accumulation clock signal $V_{ACC}$ is applied to gate electrodes V1 and V7. Gate electrodes V1 and V7 are the gate electrodes clocked by the transfer clock signal $V_{TR}$, at the previous time step (time T2). The charge packets in the photodetectors associated with gate electrodes V3 and V9 transfer to respective shift register elements in the VCCD shift registers in response to the application of the $V_{TR}$ clock signal. If gate electrode V3 is associated with row 2 and gate electrode V9 with row 5, the charge packets in the photodetectors in rows 2 and 5 transfer to the VCCD shift registers. The voltage transitions of $V_{TR}$ on gate electrodes V3 and V9 are compensated fully by the voltage transitions of $V_{ACC}$ on gate electrodes V1 and V7.

At time T4, the transfer clock signal $V_{TR}$ is applied to gate electrodes V5 and V11 while the accumulation clock signal $V_{ACC}$ is applied to gate electrodes V3 and V9. Gate electrodes V3 and V9 are the gate electrodes clocked by $V_{TR}$ at the previous time step (time T3). The charge packets in the photodetectors associated with gate electrodes V5 and V11 transfer to respective shift register elements the VCCD shift register in response to the application of the $V_{TR}$ clock signal. If gate electrode V5 is associated with row 3 and gate electrode V11 with row 6, the charge packets in the photodetectors in rows 3 and 6 transfer to the VCCD shift registers. The voltage transitions of $V_{TR}$ on gate electrodes V5 and V11 are fully compensated by the voltage transitions of $V_{ACC}$ on gate electrodes V3 and V9.

At time T5, the accumulation clock signal $V_{ACC}$ is applied to gate electrodes V5 and V11. Gate electrodes V5 and V11 are the gate electrodes clocked by $V_{TR}$ at the previous time step (time T4). The voltage transitions on gate electrodes V5 and V11 is −18 volts. This voltage transition is not compensated by any other voltage changes, so another time delay is used in the illustrated embodiment. A time delay of at least four hundred microseconds can be used. A time delay of any length can be used in other embodiments in accordance with the invention.

The photodetectors are read out in three separate time steps in the embodiment shown in FIG. 10. The charge packets in a fraction of the photodetectors transfer to respective shift register elements in the VCCD shift registers. In the illustrated embodiment, the charge packets in one third of the photodetectors transfer to the VCCD shift registers between times T2 and T3. The charge packets in another one third of the photodetectors transfer to the VCCD shift registers between times T3 and T4. And the charge packets in the remaining one third of the photodetectors transfer to the VCCD shift registers between times T4 and T5.

Other embodiments in accordance with the invention can read out the photodetectors using any fraction. The total number of rows read out is a multiple of the fraction that is read out. For example, in the embodiment illustrated in FIG. 7, a total of six rows of photodetectors are read out with one third of the rows read out at one time. Three is a multiple of six (2×3). In another embodiment, one half of the six rows of photodetectors (i.e., three rows) can be read out at one time because two is a multiple of six.

Figure 11:
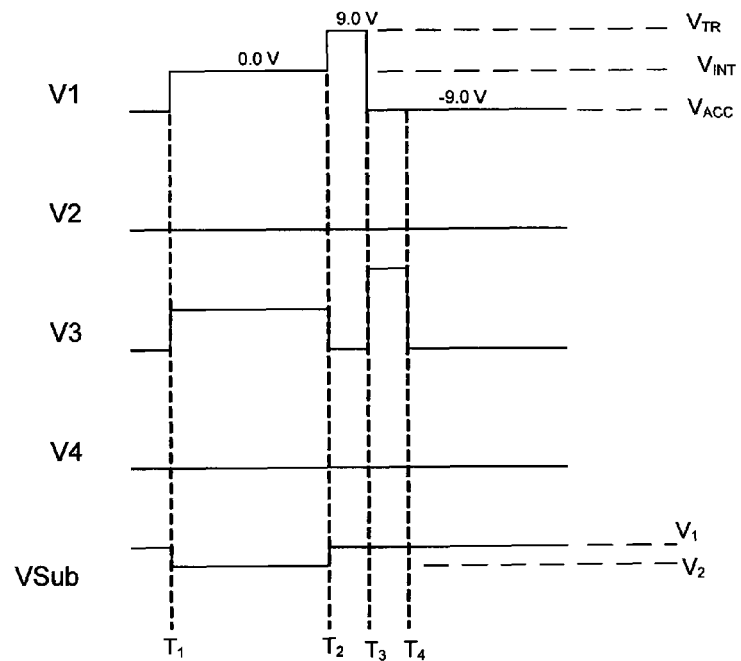
FIG. 11 depicts a second example of a clocking diagram for transferring charge from the photodetectors to respective shift register elements in the VCCD shift registers in an interline CCD image sensor in an embodiment in accordance with the invention.

Referring now to FIG. 11, there is shown a second example of a clocking diagram for transferring charge packets from the photodetectors to respective shift register elements in the VCCD shift registers in an interline CCD image sensor in an embodiment in accordance with the invention. The clocking diagram is suitable for use in a CCD image sensor having four gate electrodes (N=4) in each group of gate electrodes. The clocking diagram is described in conjunction with two-phase (M=2) VCCD shift registers shown in FIG. 7.

Prior to time T1, the accumulation clock signal $V_{ACC}$ is applied to all of the gate electrodes to place the gate electrodes in accumulation mode. To transfer charge packets from the photodetectors to the VCCD shift registers, a large voltage change must be applied to a fraction of the gate electrodes (e.g., half of the gate electrodes) because all of the gate electrodes are in accumulation mode. By way of example only, when $V_{ACC}$ is −9 volts and a transfer clock signal $V_{TR}$ of +9 volts is needed to transfer charge from the photodetectors, a voltage transition of +1.8 volts must be applied to half of the gate electrodes to transfer the charge from the photodetectors to respective shift register elements in the VCCD shift registers. The +18 volt voltage transition can produce a large amount of undesirable well bounce. The clocking diagram shown in FIG. 11 reduces the amount of well bounce when transferring charge packets from the photodetectors to the VCCD shift registers.

At time T1, an intermediate clock signal $V_{INT}$ is applied to gate electrodes V1 and V3. V1 and V3 have uncompensated rising edges at time T1 because there is no voltage change on the remaining gate electrodes V2 and V4. The voltage transition on gate electrodes V1 and V3 is +9 volts (from −9 volts to 0 volts). This voltage transition is not compensated by any other voltage changes, so a time delay is used to allow the well to settle before the next voltage change occurs at time T2. In the illustrated embodiment, a time delay of at least one hundred microseconds between time T1 and time T2 allows the well to settle. The one hundred microsecond delay is suitable for the charge transfer from the photodetectors because the voltage change at time T1 happens once per image. A time delay of any length can be used in other embodiments in accordance with the invention.

Even though the gate electrodes are not disposed over (or cover) the photodetectors (see FIG. 6B) in an embodiment in accordance with the invention, the gate electrodes are adjacent to the photodetectors and the electric fields from the gate electrodes can influence the charge capacity of the photodetectors. The voltage level of the substrate clock signal ($V_{SUB}$) applied to the substrate changes by some amount at time T1 because when the accumulation clock signal $V_{ACC}$ is applied to all of the gate electrodes (e.g., −9 volts), the photodetectors have more charge capacity than when half of the gate electrodes are clocked by the intermediate clock signal $V_{INT}$ (e.g., 0 volts). In image sensors having a vertical overflow drain, the voltage level of the substrate clock signal $V_{SUB}$ controls the charge capacity of the photodetectors. Increasing the substrate voltage reduces the photodetector charge capacity while decreasing the substrate voltage increases the photodetector charge capacity. So when V1 and V3 are clocked by the intermediate clock signal $V_{INT}$, the voltage level applied to the substrate changes from $V_{SUB1}$ to $V_{SUB2}$ to avoid having some of the charge in the photodetectors spill into an overflow drain. By way of example only, there is a two volt difference between $V_{SUB1}$ and $V_{SUB2}$ in an embodiment in accordance with the invention.

At time T2, the transfer clock signal $V_{TR}$ is applied to gate electrode V1 while the accumulation clock signal $V_{ACC}$ is applied to gate electrode V3. The voltage of the substrate clock signal $V_{SUB}$ also transitions from $V_{SUB2}$ to $V_{SUB1}$. Gate electrodes V1 and V3 are the gate electrodes clocked by $V_{INT}$ at the previous time step (time T1). In the illustrated embodiment, the voltage on gate electrode V1 transitions from 0 volts to +9 volts and the voltage on gate electrode V3 transitions from 0 volts to −9 volts. The voltage transition of $V_{TR}$ (the rising edge) on gate electrode V1 is compensated fully by the voltage transition of $V_{ACC}$ (the falling edge) on gate electrode V3.

Charge packets are transferred from the photodetectors associated with gate electrode V1 in response to the application of the transfer clock signal $V_{TR}$ (not shown). If gate electrode V1 is associated with row 1, the charge packets in the photodetectors in row 1 transfer to respective shift register elements in the VCCD shift registers.

At time T3, the transfer clock signal $V_{TR}$ is applied to gate electrode V3 while the accumulation clock signal $V_{ACC}$ is applied to gate electrode V1. Gate electrode V1 is the gate electrode clocked by $V_{TR}$ at the previous time step (time T2). The charge packets in the photodetectors associated with gate electrode V3 transfer to respective shift register elements in the VCCD shift registers in response to the application of the transfer clock signal $V_{TR}$. If gate electrode V3 is associated with row 2, the charge packets in the photodetectors in row 2 transfer to the VCCD shift registers (not shown). The voltage transition of $V_{TR}$ (the rising edge) on gate electrode V3 is compensated fully by the voltage transition of $V_{ACC}$ (the falling edge) on gate electrode V1.

At time T4, the accumulation clock signal $V_{ACC}$ is applied to gate electrode V3. Gate electrode V3 is the gate electrode clocked by $V_{TR}$ at the previous time step (time T3). The voltage on gate electrode V3 transitions from +9 volts to −9 volts. This voltage change is not compensated by any other voltage changes, so another time delay is used to allow the well to settle before the next voltage change. A time delay of at least one hundred microseconds is used in one embodiment. A time delay of any length can be used in other embodiments in accordance with the invention.

There are two operating modes for a CCD image sensor in another embodiment in accordance with the invention. One mode is an accumulation mode where an accumulation clock signal is applied to all of the gate electrodes. This mode is illustrated prior to time T1 and at time T5 in FIG. 10 and prior to time T1 and at time T4 in FIG. 11. Minority carriers (e.g., holes) accumulate at the surface of the buried channel in the VCCD shift registers during the accumulation mode.

The other mode is a charge transfer mode. The charge transfer mode includes two phases, an initial charge transfer phase followed by a final charge transfer phase. The initial charge transfer phase is depicted at times T1-T2 in FIGS. 10 and 11. During the initial charge transfer phase, at one time step an intermediate clock signal $V_{INT}$ is applied to a fraction of the gate electrodes in each distinct group of gate electrodes while substantially simultaneously applying the accumulation clock signal $V_{ACC}$ to the remaining gate electrodes in each distinct group of gate electrodes. At the next time step, a charge transfer clock signal $V_{TR}$ is applied to at least one of the gate electrodes previously clocked by the intermediate clock signal $V_{INT}$ while the accumulation clock signal $V_{ACC}$ is applied to the other gate electrode or gate electrodes previously clocked by the intermediate clock signal $V_{INT}$. At the second time step in the initial charge transfer phase, the voltage transition of $V_{TR}$ (the rising edge) is compensated fully by the voltage transition of $V_{ACC}$ (the falling edge). The magnitude of the voltage transition in one direction or polarity (e.g., positive) on the at least one gate electrode is compensated by an equal magnitude voltage transition in an opposite direction or polarity (e.g., negative) on the other gate electrode or gate electrodes in each distinct group of gate electrodes.

The final charge transfer phase is depicted at times T3-T4 in FIG. 10 and at time T3 in FIG. 11. During the final charge shifting phase, the transfer clock signal $V_{TR}$ is applied successively or cyclically to a different one gate electrode in each distinct group of gate electrodes at each time step while substantially simultaneously applying the accumulation clock signal $V_{ACC}$ to the gate electrode clocked by the transfer clock signal $V_{TR}$ at the previous time step and while maintaining the accumulation clock signal $V_{ACC}$ on the remaining gate electrodes in each distinct group of gate electrodes. During this final transfer phase, the voltage transition of $V_{TR}$ (the rising edge) is compensated fully by the voltage transition of $V_{ACC}$ (the falling edge). The magnitude of the voltage transition in one direction or polarity (e.g., positive) on the one gate electrode in each distinct group of gate electrodes is compensated by an equal magnitude voltage transition in an opposite direction or polarity (e.g., negative) on another gate electrode in each distinct group of gate electrodes.

During the final charge transfer phase, the different clock signals are determined so that the sum of products of the capacitances and voltage changes for at least a portion of a clocking cycle is substantially zero ($\Sigma C_n \Delta V_n \approx 0$).

The invention has been described in detail with particular reference to certain embodiments thereof, but it will be understood that variations and modifications can be effected within the spirit and scope of the invention. For example, voltage levels other than −10 volts, −9 volts, 0 volts, and +9 volts can be used in other embodiments. Additionally, interline CCD image sensors can be produced with a p-type buried channel and an n-type layer. In these embodiments, the voltage levels of $V_{ACC}$, $V_{DEP}$, $V_{INT}$, $V_{TR}$, and $V_{COMP}$ flip such that the positive voltages become more negative and the negative voltages become more positive. For example, the equation $V_{COMP} < V_{ACC} < V_{DEP}$ becomes $V_{COMP} > V_{ACC} > V_{DEP}$. Embodiments of the invention can be used in other types of CCD image sensors, such as, for example, full frame CCD image sensors.

And even though specific embodiments of the invention have been described herein, it should be noted that the application is not limited to these embodiments. In particular, any features described with respect to one embodiment may also be used in other embodiments, where compatible. And the features of the different embodiments may be exchanged, where compatible. For example, embodiments in accordance with the invention can use the accumulation mode, the charge shifting mode, and the charge transfer mode together, in different combinations, or independently.

1. A charge-coupled device (CCD) image sensor includes vertical CCD shift registers and gate electrodes disposed over the vertical CCD shift registers, where the gate electrodes are divided into distinct groups of gate electrodes. A method for operating the CCD image sensor includes applying, at a first time step, an accumulation clock signal having a first voltage level to all of the gate electrodes disposed over the vertical CCD shift registers for accumulating minority charge carriers; applying, at a second time step, a depletion clock signal having a different second voltage level to a respective one of the gate electrodes in each distinct group of gate electrodes while substantially simultaneously applying a compensation clock signal having a different third voltage level to all of the remaining gate electrodes in each distinct group of gate electrodes, where a difference between the first voltage level and the second voltage level applied to the respective one of the gate electrodes is compensated by a collective voltage difference between the first voltage level and the third voltage level applied to the remaining gate electrodes in each distinct repeating group of gate electrodes; and applying, at a third time step, the depletion clock signal having the second voltage level to another respective one of the gate electrodes in each distinct group of gate electrodes while substantially simultaneously applying the compensation clock signal having the third voltage level to the respective one of the gate electrodes clocked by the depletion clock signal at the second time step in each distinct group of gate electrodes, where a difference between the third voltage level and the second voltage level applied to the another respective one of the gate electrodes is compensated by a difference between the second voltage level and the third voltage level applied to the previous respective one of the gate electrodes.

2. The method in clause 1 can further include after the third time step, repeating for each remaining gate electrode in each distinct group of gate electrodes, applying the depletion clock signal having the second voltage level to a different respective one of the gate electrodes in each distinct group of gate electrodes while substantially simultaneously applying the compensation clock signal having the third voltage level to the respective one of the gate electrodes clocked by the depletion clock signal at the previous time step, where a difference between the third voltage level and the second voltage level applied to the different respective one of the gate electrodes is compensated by a difference between the second voltage level and the third voltage level applied to the respective one of the gate electrodes clocked by the depletion clock signal at the previous time step.

3. The method in clause 2 can further include after all of the gate electrodes in each distinct group of gate electrodes is clocked by the depletion clock signal, applying the accumulation clock signal having the first voltage level to all of the gate electrodes.

4. The method as in any one of the clause 1-3, where the difference between the first voltage level and the second voltage level applied to the respective one of the gate electrodes is partially compensated by the collective voltage difference between the first voltage level and the third voltage level applied to the remaining gate electrodes in each distinct repeating group of gate electrodes.

5. The method as in any one of the clauses 1-3, wherein the difference between the first voltage level and the second voltage level applied to the respective one of the gate electrodes is fully compensated by the collective voltage difference between the first voltage level and the third voltage level applied to the remaining gate electrodes in each distinct repeating group of gate electrodes.

6. A charge-coupled device (CCD) image sensor includes vertical CCD shift registers and gate electrodes disposed over the vertical CCD shift registers and the gate electrodes are divided into distinct repeating groups of gate electrodes. A method for operating the CCD image sensor includes applying, at a first time step, an accumulation clock signal having a first voltage level to all of the gate electrodes; applying, at a second time step, a depletion clock signal having a different second voltage level to a respective one of the gate electrodes in each distinct repeating group of gate electrodes while substantially simultaneously applying a compensation clock signal having a different third voltage level to the remaining gate electrodes in each distinct repeating group of gate electrodes, where the first voltage level of the accumulation clock signal is between the third voltage level of the compensation clock signal and the second voltage level of the depletion clock signal.

7. The method in clause 6 can further include after the third time step, repeating for each remaining gate electrode in each distinct group of gate electrodes, applying the depletion clock signal having the second voltage level to a different respective one of the gate electrodes in each distinct group of gate electrodes while substantially simultaneously applying the compensation clock signal having the third voltage level to the respective one of the gate electrodes clocked by the depletion clock signal at the previous time step.

8. A charge-coupled device (CCD) image sensor is adapted to operate in a charge shifting mode and in an accumulation mode. The CCD image sensor includes vertical CCD shift registers and gate electrodes disposed over the vertical CCD shift registers and the gate electrodes are divided into distinct groups of gate electrodes. A method for operating the CCD image sensor includes in an initial charge shifting phase of the charge shifting mode, applying a depletion clock signal to one gate electrode in each distinct group of gate electrodes while substantially simultaneously applying a compensation clock signal to all of the remaining gate electrodes in each distinct group of gate electrodes, where a collective voltage transition of the compensation clock signal on the remaining gate electrodes in each distinct group of gate electrodes compensates for a voltage transition of the depletion clock signal on the one gate electrode in each distinct group of gate electrodes; and in a final charge shifting phase of the charge shifting mode, applying the depletion clock signal successively to a different one gate electrode in each distinct group of gate electrodes while substantially simultaneously applying the compensation clock signal to the gate electrode clocked by the depletion clock signal at the previous time step and maintaining the compensation clock signal on the remaining gate electrodes in each distinct group of gate electrodes, where a voltage transition of the compensation clock signal on the gate electrode previously clocked by the depletion clock signal substantially compensates for a voltage transition of the depletion clock signal on each different one gate electrode in each distinct group of gate electrodes.

9. The method in clause 8 can further include in the accumulation mode, applying an accumulation clock signal to all of the gate electrodes.

10. The method as in clause 8 or clause 9, where the collective voltage transition of the compensation clock signal on the remaining gate electrodes in each distinct group of gate electrodes partially compensates for a voltage transition of the depletion clock signal on the one gate electrode in each distinct group of gate electrodes.

11. The method as in clause 8 or clause 9, where the collective voltage transition of the compensation clock signal on the remaining gate electrodes in each distinct group of gate electrodes fully compensates for a voltage transition of the depletion clock signal on the one gate electrode in each distinct group of gate electrodes.

12. A CCD image sensor includes photodetectors, vertical CCD shift registers, and gate electrodes disposed over the vertical CCD shift registers. The gate electrodes are divided into distinct repeating groups of gate electrodes. A method for operating the CCD image sensor includes applying at a first time step an intermediate clock signal having a first voltage level to a fraction of the gate electrodes in each distinct repeating group of gate electrodes; and transferring charge packets from a fraction of the photodetectors to respective vertical CCD shift registers by applying at a second time step a transfer clock signal having a different second voltage level to a fraction of the gate electrodes clocked by the intermediate clock signal at the first time step and applying an accumulation clock signal having a different third voltage level to the remaining portion of the gate electrodes clocked by the intermediate clock signal at the first time step such that a voltage transition on the gate electrodes clocked by the accumulation clock signal substantially compensates a voltage transition on the gate electrodes clocked by the transfer clock signal.

13. The method in clause 12 can further include transferring charge packets from another fraction of the photodetectors to respective vertical CCD shift registers by applying at a third time step a transfer clock signal to a fraction of the gate electrodes clocked by the accumulation clock signal and applying the accumulation clock signal to the fraction of the gate electrodes clocked by the transfer clock signal at the second time step such that a voltage transition on the portion of the gate electrodes clocked by the accumulation clock signal substantially compensates a voltage transition on the portion of the gate electrodes clocked by the transfer clock signal.

14. The method in clause 12 or in clause 13 can further include transitioning a voltage level applied to a substrate from a first voltage level to a second voltage level substantially simultaneously with the application of the intermediate clock signal at the first time step.

15. The method in clause 14 can further include transitioning the voltage level applied to a substrate from the second voltage level to the first voltage level substantially simultaneously with the application of the transfer clock signal at the second time step.

16. A charge-coupled device (CCD) image sensor is adapted to operate in a charge transfer mode and in an accumulation mode. The CCD image sensor includes vertical CCD shift registers and gate electrodes disposed over the vertical CCD shift registers. The gate electrodes are divided into distinct groups of gate electrodes. A method for operating the CCD image sensor includes in an initial charge transfer phase of the charge transfer mode, applying at a first time step an intermediate clock signal to a fraction of the gate electrodes in each distinct group of gate electrodes while substantially simultaneously applying an accumulation clock signal to the remaining gate electrodes in each distinct group of gate electrodes, and applying at a second time step a transfer clock signal to at least one of the gate electrodes in each distinct group of gate electrodes clocked by the intermediate clock signal at the first time step while substantially simultaneously applying the accumulation clock signal to the remaining gate electrodes in each distinct group of gate electrodes clocked by the intermediate clock signal at the first time step, where a voltage transition of the accumulation clock signal applied to the remaining gate electrodes in each distinct group of gate electrodes compensates for a voltage transition of the transfer clock signal applied to at least one of the gate electrodes in each distinct group of gate electrodes; and in a final charge transfer phase of the charge transfer mode, at each subsequent time step applying the transfer clock signal successively to a different fraction of the gate electrodes in each distinct group of gate electrodes while substantially simultaneously applying the accumulation clock signal to each gate electrode clocked by the transfer clock signal at the previous time step and maintaining the accumulation clock signal on the remaining gate electrodes in each distinct group of gate electrodes, where a voltage transition of the accumulation clock signal applied to each gate electrode clocked by the transfer clock signal at the previous time step compensates a voltage transition of the transfer clock signal.

17. The method in clause 16 can further include in the accumulation mode, applying an accumulation clock signal to all of the gate electrodes.

18. The method in clause 16 or in clause 17 can further include transitioning a voltage level applied to a substrate from a first voltage level to a second voltage level substantially simultaneously with the application of the intermediate clock signal at the first time step.

19. The method in clause 18 can further include transitioning the voltage level applied to a substrate from the second voltage level to the first voltage level substantially simultaneously with the application of the transfer clock signal at the second time step.

20. The method in clause 19 can further include in the accumulation mode, applying an accumulation clock signal to all of the gate electrodes.

21. The method as in any one of the clauses 16-20, where the CCD image sensor is further adapted to operate in a charge shifting mode.

22. The method as in clause 21 can further include in an initial charge shifting phase of the charge shifting mode, applying a depletion clock signal to one gate electrode in each distinct group of gate electrodes while substantially simultaneously applying a compensation clock signal to the remaining gate electrodes in each distinct group of gate electrodes, where a collective voltage transition of the compensation clock signal on the remaining gate electrodes in each distinct group of gate electrodes compensates for a voltage transition of the depletion clock signal on the one gate electrode in each distinct group of gate electrodes; and in a final charge shifting phase of the charge shifting mode, at each subsequent time step applying the depletion clock signal successively to a different one gate electrode in each distinct group of gate electrodes while substantially simultaneously applying the compensation clock signal to the gate electrode clocked by the depletion clock signal at the previous clock signal and maintaining the compensation clock signal on the remaining gate electrodes in each distinct group of gate electrodes, where a voltage transition of the compensation clock signal on the gate electrode previously clocked by the depletion clock signal substantially compensates for a voltage transition of the depletion clock signal on each different one gate electrode in each distinct group of gate electrodes.

23. The method in clause 22 can further include in the accumulation mode, applying an accumulation clock signal to all of the gate electrodes.

24. A charge-coupled device (CCD) image sensor includes vertical CCD shift registers and gate electrodes disposed over the vertical CCD shift registers. The gate electrodes are divided into distinct groups of gate electrodes. The CCD image sensor includes means for applying, at a first time step, an accumulation clock signal having a first voltage level to all of the gate electrodes disposed over the vertical CCD shift registers for accumulating minority charge carriers; means for applying, at a second time step, a depletion clock signal having a different second voltage level to a respective one of the gate electrodes in each distinct group of gate electrodes while substantially simultaneously applying a compensation clock signal having a different third voltage level to all of the remaining gate electrodes in each distinct group of gate electrodes, where a difference between the first voltage level and the second voltage level applied to the respective one of the gate electrodes is compensated by a collective voltage difference between the first voltage level and the third voltage level applied to the remaining gate electrodes in each distinct repeating group of gate electrodes; and means for applying, at a third time step, the depletion clock signal having the second voltage level to another respective one of the gate electrodes in each distinct group of gate electrodes while substantially simultaneously applying the compensation clock signal having the third voltage level to the respective one of the gate electrodes clocked by the depletion clock signal at the second time step in each distinct group of gate electrodes, where a difference between the third voltage level and the second voltage level applied to the another respective one of the gate electrodes is compensated by a difference between the second voltage level and the third voltage level applied to the previous respective one of the gate electrodes.

25. The CCD image sensor in clause 24 can further include after the third time step, means for applying to each remaining gate electrode in each distinct group of gate electrodes the depletion clock signal having the second voltage level to a different respective one of the gate electrodes in each distinct group of gate electrodes while substantially simultaneously applying the compensation clock signal having the third voltage level to the respective one of the gate electrodes clocked by the depletion clock signal at the previous time step, where a difference between the third voltage level and the second voltage level applied to the different respective one of the gate electrodes is compensated by a difference between the second voltage level and the third voltage level applied to the respective one of the gate electrodes clocked by the depletion clock signal at the previous time step.

26. The CCD image sensor in clause 25 can further include after all of the gate electrodes in each distinct group of gate electrodes is clocked by the depletion clock signal, means for applying the accumulation clock signal having the first voltage level to all of the gate electrodes.

27. The CCD image sensor as in any one of clauses 24-26, where the difference between the first voltage level and the second voltage level applied to the respective one of the gate electrodes is partially compensated by the collective voltage difference between the first voltage level and the third voltage level applied to the remaining gate electrodes in each distinct repeating group of gate electrodes.

28. The CCD image sensor as in any one of clauses 24-26, where the difference between the first voltage level and the second voltage level applied to the respective one of the gate electrodes is fully compensated by the collective voltage difference between the first voltage level and the third voltage level applied to the remaining gate electrodes in each distinct repeating group of gate electrodes.

29. A charge-coupled device (CCD) image sensor is adapted to operate in a charge shifting mode and in an accumulation mode. The CCD image sensor includes vertical CCD shift registers and gate electrodes disposed over the vertical CCD shift registers. The gate electrodes are divided into distinct groups of gate electrodes. The CCD image sensor includes in an initial charge shifting phase of the charge shifting mode, means for applying a depletion clock signal to one gate electrode in each distinct group of gate electrodes while substantially simultaneously applying a compensation clock signal to all of the remaining gate electrodes in each distinct group of gate electrodes, where a collective voltage transition of the compensation clock signal on the remaining gate electrodes in each distinct group of gate electrodes compensates for a voltage transition of the depletion clock signal on the one gate electrode in each distinct group of gate electrodes; and in a final charge shifting phase of the charge shifting mode, means for applying the depletion clock signal successively to a different one gate electrode in each distinct group of gate electrodes while substantially simultaneously applying the compensation clock signal to the gate electrode clocked by the depletion clock signal at the previous time step and maintaining the compensation clock signal on the remaining gate electrodes in each distinct group of gate electrodes, where a voltage transition of the compensation clock signal on the gate electrode previously clocked by the depletion clock signal substantially compensates for a voltage transition of the depletion clock signal on each different one gate electrode in each distinct group of gate electrodes.

30. The CCD image sensor in clause 29 can further include in the accumulation mode, means for applying an accumulation clock signal to all of the gate electrodes.

31. The CCD image sensor as in clause 29 or clause 30, where the collective voltage transition of the compensation clock signal on the remaining gate electrodes in each distinct group of gate electrodes partially compensates for a voltage transition of the depletion clock signal on the one gate electrode in each distinct group of gate electrodes.

32. The CCD image sensor as in clause 29 or clause 30, where the collective voltage transition of the compensation clock signal on the remaining gate electrodes in each distinct group of gate electrodes fully compensates for a voltage transition of the depletion clock signal on the one gate electrode in each distinct group of gate electrodes.

33. A charge-coupled device (CCD) image sensor includes photodetectors and vertical CCD shift registers with gate electrodes disposed over the vertical CCD shift registers. The gate electrodes are divided into distinct groups of gate electrodes. The CCD image sensor includes: means for applying at a first time step an intermediate clock signal having a first voltage level to a fraction of the gate electrodes in each distinct group of gate electrodes; and means for applying at a second time step a transfer clock signal having a different second voltage level to a fraction of the gate electrodes clocked by the intermediate clock signal at the first time step and applying an accumulation clock signal having a different third voltage level to the remaining portion of the gate electrodes clocked by the intermediate clock signal at the first time step such that a voltage transition on the gate electrodes clocked by the accumulation clock signal substantially compensates a voltage transition on the gate electrodes clocked by the transfer clock signal.

34. The CCD image sensor in clause 33 can further include means for applying at a third time step a transfer clock signal to a fraction of the gate electrodes clocked by the accumulation clock signal and applying the accumulation clock signal to the fraction of the gate electrodes clocked by the transfer clock signal at the second time step such that a voltage transition on the portion of the gate electrodes clocked by the accumulation clock signal substantially compensates a voltage transition on the portion of the gate electrodes clocked by the transfer clock signal.

35. The CCD image sensor in clause 33 or in clause 34 can further include means for transitioning a voltage level applied to a substrate from a first voltage level to a second voltage level substantially simultaneously with the application of the intermediate clock signal at the first time step.

36. The CCD image sensor in clause 35 can further include means for transitioning the voltage level applied to a substrate from the second voltage level to the first voltage level substantially simultaneously with the application of the transfer clock signal at the second time step.

37. A charge-coupled device (CCD) image sensor is adapted to operate in a charge transfer mode and in an accumulation mode. The CCD image sensor includes vertical CCD shift registers and gate electrodes disposed over the vertical CCD shift registers. The gate electrodes are divided into distinct groups of gate electrodes, The CCD image sensor includes in an initial charge transfer phase of the charge transfer mode, means for applying at a first time step an intermediate clock signal to a fraction of the gate electrodes in each distinct group of gate electrodes while substantially simultaneously applying an accumulation clock signal to the remaining gate electrodes in each distinct group of gate electrodes, and means for applying at a second time step a transfer clock signal to at least one of the gate electrodes in each distinct group of gate electrodes clocked by the intermediate clock signal at the first time step while substantially simultaneously applying the accumulation clock signal to the remaining gate electrodes in each distinct group of gate electrodes clocked by the intermediate clock signal at the first time step, where a voltage transition of the accumulation clock signal applied to the remaining gate electrodes in each distinct group of gate electrodes compensates for a voltage transition of the transfer clock signal applied to at least one of the gate electrodes in each distinct group of gate electrodes; and in a final charge transfer phase of the charge transfer mode, means for applying at each subsequent time step the transfer clock signal successively to a different fraction of the gate electrodes in each distinct group of gate electrodes while substantially simultaneously applying the accumulation clock signal to each gate electrode clocked by the transfer clock signal at the previous time step and maintaining the accumulation clock signal on the remaining gate electrodes in each distinct group of gate electrodes, where a voltage transition of the accumulation clock signal applied to each gate electrode clocked by the transfer clock signal at the previous time step compensates a voltage transition of the transfer clock signal.

38. The CCD image sensor in clause 37 can further include in the accumulation mode, means for applying an accumulation clock signal to all of the gate electrodes.

39. The CCD image sensor in clause 37 or in clause 38 can further include means for transitioning a voltage level applied to a substrate from a first voltage level to a second voltage level substantially simultaneously with the application of the intermediate clock signal at the first time step.

40. The CCD image sensor in clause 39 can further include means for transitioning the voltage level applied to a substrate from the second voltage level to the first voltage level substantially simultaneously with the application of the transfer clock signal at the second time step.

41. The CCD image sensor in clause 40 can further include in the accumulation mode, means for applying an accumulation clock signal to all of the gate electrodes.

42. The CCD image sensor as in any one of clauses 37-41, where the CCD image sensor is further adapted to operate in a charge shifting mode.

43. The CCD image sensor in clause 42 can further include in an initial charge shifting phase of the charge shifting mode, means for applying a depletion clock signal to one gate electrode in each distinct group of gate electrodes while substantially simultaneously applying a compensation clock signal to the remaining gate electrodes in each distinct group of gate electrodes, where a collective voltage transition of the compensation clock signal on the remaining gate electrodes in each distinct group of gate electrodes compensates for a voltage transition of the depletion clock signal on the one gate electrode in each distinct group of gate electrodes; and in a final charge shifting phase of the charge shifting mode, means for applying at each subsequent time step the depletion clock signal successively to a different one gate electrode in each distinct group of gate electrodes while substantially simultaneously applying the compensation clock signal to the gate electrode clocked by the depletion clock signal at the previous clock signal and maintaining the compensation clock signal on the remaining gate electrodes in each distinct group of gate electrodes, where a voltage transition of the compensation clock signal on the gate electrode previously clocked by the depletion clock signal substantially compensates for a voltage transition of the depletion clock signal on each different one gate electrode in each distinct group of gate electrodes.

44. The CCD image sensor in clause 43 can further include in the accumulation mode, means for applying an accumulation clock signal to all of the gate electrodes.

45. A charge-coupled device (CCD) image sensor is adapted to operate in a charge transfer mode and in an accumulation mode. The CCD image sensor includes vertical CCD shift registers and gate electrodes disposed over the vertical CCD shift registers. The gate electrodes are divided into distinct groups of gate electrodes, The CCD image sensor includes in an initial charge transfer phase of the charge transfer mode, means for applying at a first time step an intermediate clock signal to a fraction of the gate electrodes in each distinct group of gate electrodes while substantially simultaneously applying an accumulation clock signal to the remaining gate electrodes in each distinct group of gate electrodes, and means for applying at a second time step a transfer clock signal to at least one of the gate electrodes in each distinct group of gate electrodes clocked by the intermediate clock signal at the first time step while substantially simultaneously applying the accumulation clock signal to the remaining gate electrodes in each distinct group of gate electrodes clocked by the intermediate clock signal at the first time step, where the transfer and accumulation clock signals applied to the gate electrodes at the second time step are determined so that a sum of products of capacitances and voltage changes is substantially zero; and in a final charge transfer phase of the charge transfer mode, means for applying at each subsequent time step the transfer clock signal successively to a different fraction of the gate electrodes in each distinct group of gate electrodes while substantially simultaneously applying the accumulation clock signal to each gate electrode clocked by the transfer clock signal at the previous time step and maintaining the accumulation clock signal on the remaining gate electrodes in each distinct group of gate electrodes, where the transfer and accumulation clock signals applied to the gate electrodes in each distinct group of gate electrodes are determined so that a sum of products of capacitances and voltage changes is substantially zero.

46. The CCD image sensor in clause 45 can further include in the accumulation mode, means for applying an accumulation clock signal to all of the gate electrodes.

47. The CCD image sensor in clause 45 or in clause 46 can further include means for transitioning a voltage level applied to a substrate from a first voltage level to a second voltage level substantially simultaneously with the application of the intermediate clock signal at the first time step.

48. The CCD image sensor in clause 47 can further include means for transitioning the voltage level applied to a substrate from the second voltage level to the first voltage level substantially simultaneously with the application of the transfer clock signal at the second time step.

49. The CCD image sensor in clause 48 can further include in the accumulation mode, means for applying an accumulation clock signal to all of the gate electrodes.

50. The CCD image sensor as in any one of clauses 45-49, where the CCD image sensor is further adapted to operate in a charge shifting mode.

51. The CCD image sensor in clause 50 can further include in an initial charge shifting phase of the charge shifting mode, means for applying a depletion clock signal to one gate electrode in each distinct group of gate electrodes while substantially simultaneously applying a compensation clock signal to the remaining gate electrodes in each distinct group of gate electrodes, where the depletion and compensation clock signals applied to the gate electrodes are determined so that a sum of products of capacitances and voltage changes is substantially zero; and in a final charge shifting phase of the charge shifting mode, means for applying at each subsequent time step the depletion clock signal successively to a different one gate electrode in each distinct group of gate electrodes while substantially simultaneously applying the compensation clock signal to the gate electrode clocked by the depletion clock signal at the previous clock signal and maintaining the compensation clock signal on the remaining gate electrodes in each distinct group of gate electrodes, where the depletion and compensation clock signals applied to the gate electrodes are determined so that a sum of products of capacitances and voltage changes is substantially zero.

52. The CCD image sensor in clause 51 can further include in the accumulation mode, means for applying an accumulation clock signal to all of the gate electrodes.

53. A charge-coupled device (CCD) image sensor is adapted to operate in a charge shifting mode and in an accumulation mode. The CCD image sensor includes vertical CCD shift registers and gate electrodes disposed over the vertical CCD shift registers and the gate electrodes are divided into distinct groups of gate electrodes. A method for operating the CCD image sensor includes in an initial charge shifting phase of the charge shifting mode, applying a depletion clock signal to one gate electrode in each distinct group of gate electrodes while substantially simultaneously applying a compensation clock signal to all of the remaining gate electrodes in each distinct group of gate electrodes, where the depletion and compensation clock signals applied to the gate electrodes are determined so that a sum of products of capacitances and voltage changes is substantially zero; and in a final charge shifting phase of the charge shifting mode, applying the depletion clock signal successively to a different one gate electrode in each distinct group of gate electrodes while substantially simultaneously applying the compensation clock signal to the gate electrode clocked by the depletion clock signal at the previous time step and maintaining the compensation clock signal on the remaining gate electrodes in each distinct group of gate electrodes, where the depletion and compensation clock signals applied to the gate electrodes are determined so that a sum of products of capacitances and voltage changes is substantially zero.

54. The method in clause 53 can further include in the accumulation mode, applying an accumulation clock signal to all of the gate electrodes.

PARTS LIST 100 image sensor
102 photodetector
104 imaging area
106 vertical charge-coupled device (VCCD) shift register
108 charge packet
110 shift register element
112 horizontal charge-coupled device (HCCD) shift register
114 output circuit
200 gate electrode
202 gate electrode
204 substrate layer
206 layer
208 buried channel
210 well contact
400 voltage transition
402 voltage transition
500 image capture device
502 light
504 imaging stage
506 image sensor
508 clock driver
510 processor
512 memory
514 display
516 one or more additional input/output elements
600 imaging area
602 VCCD shift register
604 photodetector
606 gate electrode
608 gate electrode
610 signal lines
612 two rows of imaging area
700 group of gate electrodes
702 charge packet
704 charge packet
706 charge packet
708 charge packet
710 charge packet
712 charge packet

What is claimed is:

1. A charge-coupled device (CCD) image sensor including a plurality of vertical CCD shift registers and a plurality of gate electrodes disposed over the vertical CCD shift registers, wherein the plurality of gate electrodes are divided into distinct groups of gate electrodes, the CCD image sensor comprising:
    means for applying, at a first time step, an accumulation clock signal having a first voltage level to all of the gate electrodes disposed over the vertical CCD shift registers for accumulating minority charge carriers;
    means for applying, at a second time step, a depletion clock signal having a different second voltage level to a respective one of the gate electrodes in each distinct group of gate electrodes while substantially simultaneously applying a compensation clock signal having a different third voltage level to all of the remaining gate electrodes in each distinct group of gate electrodes, wherein a difference between the first voltage level and the second voltage level applied to the respective one of the gate electrodes is compensated by a collective voltage difference between the first voltage level and the third voltage level applied to the remaining gate electrodes in each distinct repeating group of gate electrodes; and
    means for applying, at a third time step, the depletion clock signal having the second voltage level to another respective one of the gate electrodes in each distinct group of gate electrodes while substantially simultaneously applying the compensation clock signal having the third voltage level to the respective one of the gate electrodes clocked by the depletion clock signal at the second time step in each distinct group of gate electrodes, wherein a difference between the third voltage level and the second voltage level applied to the another respective one of the gate electrodes is compensated by a difference between the second voltage level and the third voltage level applied to the previous respective one of the gate electrodes.

2. The CCD image sensor as in claim 1, further comprising after the third time step, means for applying to each remaining gate electrode in each distinct group of gate electrodes the depletion clock signal having the second voltage level to a different respective one of the gate electrodes in each distinct group of gate electrodes while substantially simultaneously applying the compensation clock signal having the third voltage level to the respective one of the gate electrodes clocked by the depletion clock signal at the previous time step, wherein a difference between the third voltage level and the second voltage level applied to the different respective one of the gate electrodes is compensated by a difference between the second voltage level and the third voltage level applied to the respective one of the gate electrodes clocked by the depletion clock signal at the previous time step.

3. The CCD image sensor as in claim 2, further comprising after all of the gate electrodes in each distinct group of gate electrodes is clocked by the depletion clock signal, means for applying the accumulation clock signal having the first voltage level to all of the gate electrodes.

4. The CCD image sensor as in claim 1, wherein the difference between the first voltage level and the second voltage level applied to the respective one of the gate electrodes is partially compensated by the collective voltage difference between the first voltage level and the third voltage level applied to the remaining gate electrodes in each distinct repeating group of gate electrodes.

5. The CCD image sensor as in claim 1, wherein the difference between the first voltage level and the second voltage level applied to the respective one of the gate electrodes is fully compensated by the collective voltage difference between the first voltage level and the third voltage level applied to the remaining gate electrodes in each distinct repeating group of gate electrodes.

6. A charge-coupled device (CCD) image sensor adapted to operate in a charge shifting mode and in an accumulation mode, wherein the CCD image sensor includes a plurality of vertical CCD shift registers and a plurality of gate electrodes disposed over the vertical CCD shift registers and the plurality of gate electrodes are divided into distinct groups of gate electrodes, the CCD image sensor comprising:

in an initial charge shifting phase of the charge shifting mode, means for applying a depletion clock signal to one gate electrode in each distinct group of gate electrodes while substantially simultaneously applying a compensation clock signal to all of the remaining gate electrodes in each distinct group of gate electrodes, wherein a collective voltage transition of the compensation clock signal on the remaining gate electrodes in each distinct group of gate electrodes compensates for a voltage transition of the depletion clock signal on the one gate electrode in each distinct group of gate electrodes; and in a final charge shifting phase of the charge shifting mode, means for applying the depletion clock signal successively to a different one gate electrode in each distinct group of gate electrodes while substantially simultaneously applying the compensation clock signal to the gate electrode clocked by the depletion clock signal at the previous time step and maintaining the compensation clock signal on the remaining gate electrodes in each distinct group of gate electrodes, wherein a voltage transition of the compensation clock signal on the gate electrode previously clocked by the depletion clock signal substantially compensates for a voltage transition of the depletion clock signal on each different one gate electrode in each distinct group of gate electrodes.

7. The CCD image sensor as in claim 6, further comprising in the accumulation mode, means for applying an accumulation clock signal to all of the gate electrodes.

8. The CCD image sensor as in claim 6, wherein the collective voltage transition of the compensation clock signal on the remaining gate electrodes in each distinct group of gate electrodes partially compensates for a voltage transition of the depletion clock signal on the one gate electrode in each distinct group of gate electrodes.

9. The CCD image sensor as in claim 6, wherein the collective voltage transition of the compensation clock signal on the remaining gate electrodes in each distinct group of gate electrodes fully compensates for a voltage transition of the depletion clock signal on the one gate electrode in each distinct group of gate electrodes.

* * * * *